(12) United States Patent
Choi et al.

(10) Patent No.: US 12,700,458 B2
(45) Date of Patent: Aug. 4, 2026

(54) MEMORY DEVICE AND METHOD OF OPERATING MEMORY DEVICE FOR PROGRAMMING SELECT TRANSISTORS

(71) Applicant: SK hynix Inc., Icheon-si (KR)

(72) Inventors: Suk Hwan Choi, Icheon-si (KR); Dong Hun Kwak, Icheon-si (KR); Se Chun Park, Icheon-si (KR)

(73) Assignee: SK hynic Inc., Incheon-si (KR)

( * ) Notice: Subject to any disclaimer, the term of this patent is extended or adjusted under 35 U.S.C. 154(b) by 177 days.

(21) Appl. No.: 18/514,704

(22) Filed: Nov. 20, 2023

(65) Prior Publication Data

US 2024/0428861 A1 Dec. 26, 2024

(30) Foreign Application Priority Data

Jun. 22, 2023 (KR) ........................ 10-2023-0080557

(51) Int. Cl.
| | |
|---|---|
| *G11C 16/10* | (2006.01) |
| *G11C 16/04* | (2006.01) |
| *G11C 16/16* | (2006.01) |
| *G11C 16/34* | (2006.01) |

(52) U.S. Cl.
CPC ........ *G11C 16/102* (2013.01); *G11C 16/0433* (2013.01); *G11C 16/16* (2013.01); *G11C 16/3459* (2013.01)

(58) Field of Classification Search
CPC ... G11C 16/102; G11C 16/0433; G11C 16/16; G11C 16/3459; G11C 11/5628; G11C 11/5635; G11C 16/0483; G11C 16/10; G11C 16/3445; G11C 16/14; G11C 16/34; G11C 16/3404
See application file for complete search history.

(56) References Cited

U.S. PATENT DOCUMENTS

| | | | | |
|---|---|---|---|---|
| 2013/0322174 A1* | 12/2013 | Li | ........................ | G11C 29/028 365/185.24 |
| 2014/0219027 A1* | 8/2014 | Dong | ................. | G11C 16/3459 365/185.17 |
| 2014/0247667 A1* | 9/2014 | Dutta | .................. | G11C 11/5635 365/185.22 |
| 2016/0055911 A1 | 2/2016 | Nguyen et al. | | |
| 2016/0055919 A1* | 2/2016 | Park | ................... | G11C 16/0483 365/185.12 |
| 2016/0099063 A1* | 4/2016 | Shim | ................. | G11C 16/3445 365/185.29 |
| 2019/0189216 A1* | 6/2019 | Baek | ...................... | G11C 16/10 |
| 2019/0333581 A1* | 10/2019 | Diep | ...................... | H10B 43/50 |

FOREIGN PATENT DOCUMENTS

KR 1020160029506 A 3/2016

* cited by examiner

*Primary Examiner* — Amir Zarabian
*Assistant Examiner* — Bradley S Coon
(74) *Attorney, Agent, or Firm* — WILLIAM PARK AND ASSOCIATES LTD.

(57) ABSTRACT

An operating method of a memory device may include performing a pre-program operation on selection transistors that are included in strings, wherein each of the strings comprises a first source selection transistor, a second source selection transistor, a plurality of memory cells, and a drain selection transistor that are sequentially coupled, and performing an erase operation and a fine program operation on at least one of the selection transistors.

22 Claims, 21 Drawing Sheets

MEMORY DEVICE AND METHOD OF OPERATING MEMORY DEVICE FOR PROGRAMMING SELECT TRANSISTORS

CROSS-REFERENCES TO RELATED APPLICATION

The present application claims priority under 35 U.S.C. § 119(a) to Korean Patent Application No. 10-2023-0080557, filed on Jun. 22, 2023, in the Korean Intellectual Property Office, which is incorporated herein by reference in its entirety.

BACKGROUND

1. Technical Field

The present technology relates to a memory device, and more particularly, to a nonvolatile memory device.

2. Related Art

An electronic device includes many electronic components. Among the electronic components, a computer system may include many electronic components composed of a semiconductor. Among the semiconductor devices that constitute the computer system, a host device, such as a processor or a memory controller, may perform data communication with the memory device. The memory device may include a plurality of memory cells, which may be specified by a word line and a bit line, and may store data.

The memory device may include selection transistors for selecting memory cells. The selection transistor may be constructed similarly to the memory cell. Accordingly, the selection transistor may be controlled similarly to the memory cell. In order to properly select a desired memory cell, a scheme for finely controlling the selection transistors may be required.

SUMMARY

In an embodiment, an operating method of a memory device may include performing a pre-program operation on selection transistors that are included in strings, wherein each of the strings includes a first source selection transistor, a second source selection transistor, a plurality of memory cells, and a drain selection transistor that are sequentially coupled, and performing an erase operation and a fine program operation on at least one of the selection transistors.

In an embodiment, an operating method of a memory device may include performing a first pre-program operation on selection transistors that are included in strings, wherein each of the strings includes a plurality of memory cells that are coupled between the selection transistors, and sequentially performing an erase operation, a second pre-program operation, a slow transistor masking operation, and a fine program operation on target selection transistors, among the selection transistors that are included in the strings.

In an embodiment, a memory device may include a memory block including a plurality of strings each including a first source selection transistor, a second source selection transistor, a plurality of memory cells, and a drain selection transistor that are sequentially coupled, and a control circuit configured to perform a pre-program operation on selection transistors that are included in the strings and configured to perform an erase operation and a fine program operation on at least one of the selection transistors.

BRIEF DESCRIPTION OF THE DRAWINGS

FIG. 2 is a circuit diagram illustrating a memory block illustrated in FIG. 1.

FIG. 3 is a diagram illustrating strings that are coupled to a bit line according to an embodiment.

DETAILED DESCRIPTION

Hereinafter, embodiments of the present technology will be described in detail with reference to the accompanying drawings.

Figure 1:
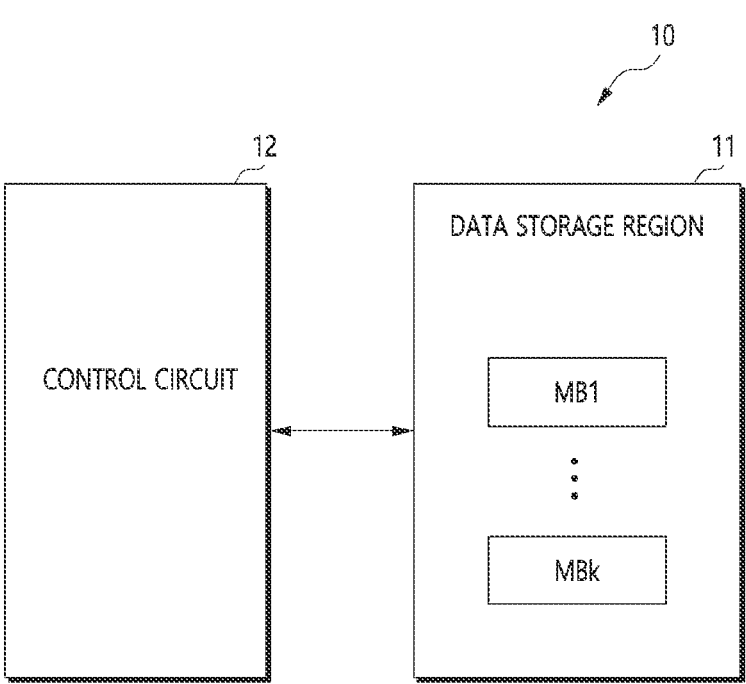
FIG. 1 is a block diagram illustrating a memory device according to an embodiment.

FIG. 1 is a block diagram illustrating a memory device 10 according to an embodiment.

Referring to FIG. 1, the memory device may operate under the control of an external device, for example, a controller. Operations of the memory device may include a read operation, a write operation, an erase operation, etc.

The memory device may include various types of memory, such as NAND flash memory, 3D NAND flash memory, NOR flash memory, resistive random access memory (RRAM), phase-change memory (PRAM), magnetoresistive random access memory (MRAM), ferroelectric random access memory (FRAM), or spin transfer torque random access memory (STT-RAM).

The memory device 10 may include a data storage region 11 and a control circuit 12. The data storage region 11 may include a plurality of memory blocks MB1 to MBk.

Figure 2:
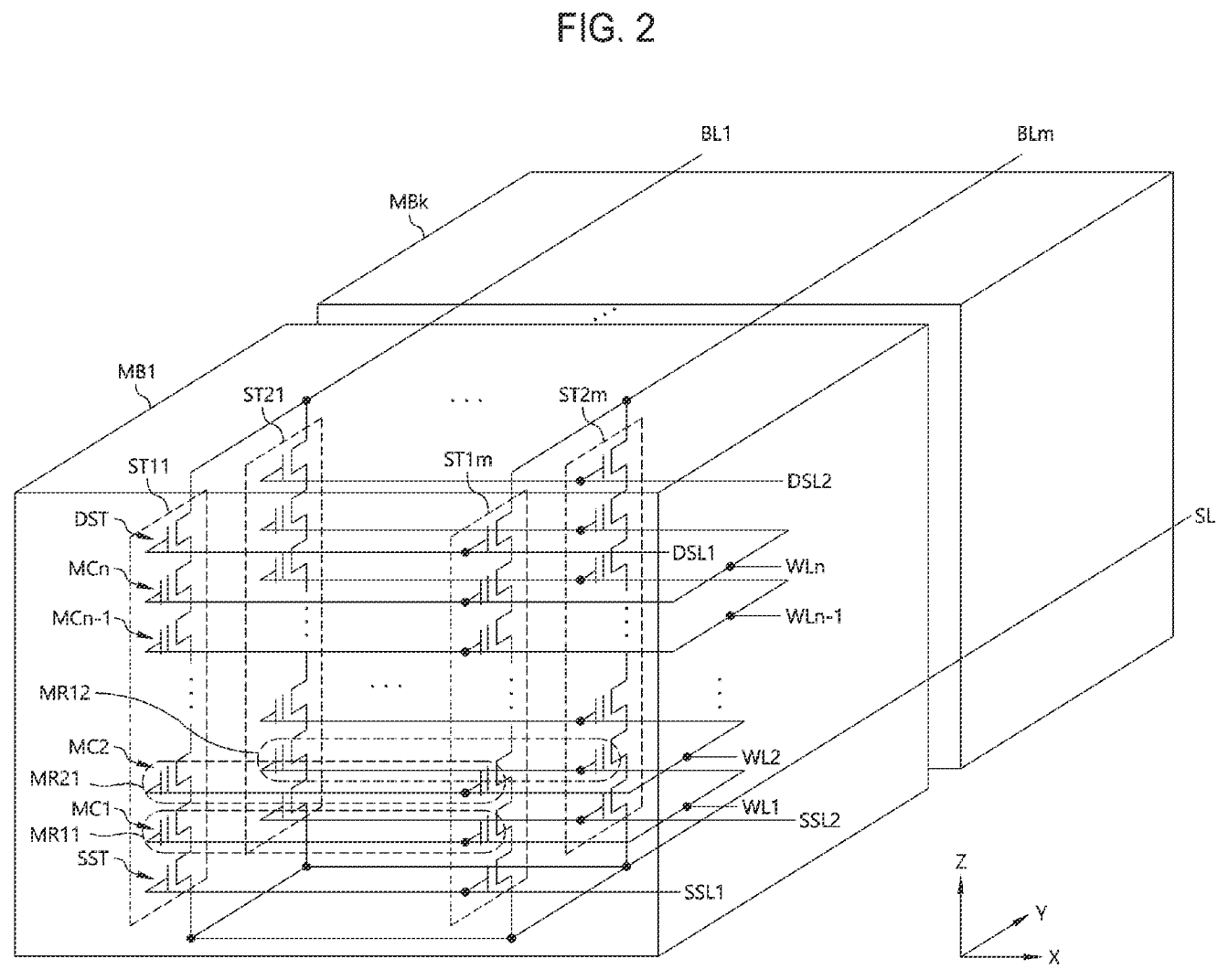

FIG. 2 is a circuit diagram illustrating the memory block MB1, illustrated in FIG. 1. In FIG. 1, each of the memory blocks MB1 to MBk may be constructed similarly to the memory block MB1, illustrated in FIG. 2.

Referring to FIG. 2, the memory block MB1 may include strings ST11 to ST1$m$ and ST21 to ST2$m$. Each of the strings ST11 to ST1$m$ and ST21 to ST2$m$ may extend in a vertical direction (i.e., a Z direction). m strings may be arranged in a row direction (i.e., an X direction) within the memory block MB1. FIG. 2 illustrates two strings that are arranged in a column direction (i.e., a Y direction), but this is for convenience of description. Three or more strings may be arranged in the column direction (i.e., the Y direction).

The strings ST11 to ST1$m$ and ST21 to ST2$m$ may be constructed identically. For example, the string ST11 may include a source selection transistor SST, memory cells MC1 to MCn, and a drain selection transistor DST that are coupled in series between a source line SL and a bit line BL1. A source of the source selection transistor SST may be coupled to the source line SL. A drain of the drain selection transistor DST may be coupled to the bit line BL1. The memory cells MC1 to MCn may be coupled in series between the source selection transistor SST and the drain selection transistor DST. According to an embodiment, the strings ST11 to ST1$m$ and ST21 to ST2$m$ may each include a plurality of drain selection transistors that are continuously coupled in series. According to an embodiment, the strings ST11 to ST1$m$ and ST21 to ST2$m$ may each include a plurality of source selection transistors that are continuously coupled in series.

The gates of the source selection transistors of strings arranged in the same row may be coupled to the same source selection line. For example, the gates of the source selection transistors of the strings ST11 to ST1$m$ in a first row may be coupled to a source selection line SSL1. For example, the gates of the source selection transistors of the strings ST21 to ST2$m$ in a second row may be coupled to a source selection line SSL2. In another embodiment, the source selection transistors of the strings ST11 to ST1$m$ and ST21 to ST2$m$ may be coupled to one source selection line in common.

The gates of the drain selection transistors of strings that have been arranged in the same row may be coupled to the same drain selection line. For example, the gates of the drain selection transistors of the strings ST11 to ST1$m$ in the first row may be coupled to a drain selection line DSL1. For example, the gates of the drain selection transistors of the strings ST21 to ST2$m$ in the second row may be coupled to a drain selection line DSL2.

Strings that have been arranged in the same column may be coupled to the same bit line. For example, strings ST11 and ST21 in a first column may be coupled to a bit line BL1. For example, the strings ST1$m$ and ST2$m$ in an m-th column may be coupled to a bit line BLm.

The gates of memory cells at the same location in the vertical direction (i.e., same level in the Z direction) may be coupled to the same word line. For example, in the strings ST11 to ST1$m$ and ST21 to ST2$m$, memory cells at the same location in a direction perpendicular to the memory cell MC1 (i.e., on the same X-Y plane) may be coupled to a word line WL1.

Memory cells that are coupled to the same word line in the same row, among the memory cells, may constitute one memory region. For example, memory cells that are coupled to the word line WL1 in the first row may constitute one memory region MR11. For example, memory cells that are coupled to the word line WL1 in the second row may constitute one memory region MR12. For example, memory cells that are coupled to a word line WL2 in the first row may constitute one memory region MR21. Each word line may be coupled to a plurality of memory regions depending on the number of rows. Memory cells that constitute one memory region may be simultaneously programmed.

Figure 3:
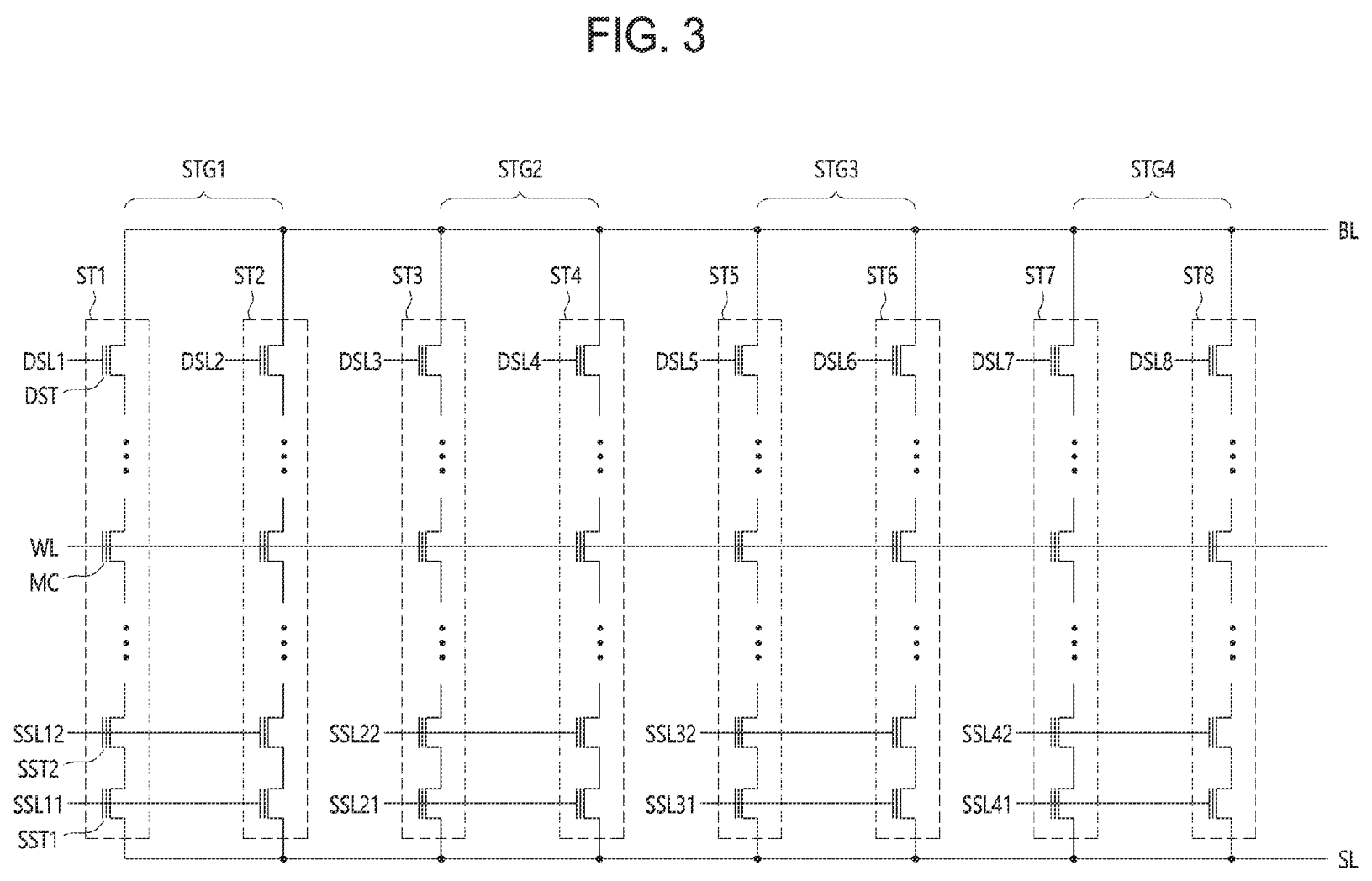

FIG. 3 is a diagram illustrating strings ST1 to ST8 that are coupled to a bit line BL according to an embodiment. The number of components, illustrated in FIG. 3, may be an example.

Referring to FIG. 3, the bit line BL may be coupled to the strings ST1 to ST8. The strings ST1 to ST8 may be similarly constructed. The string ST1 is described as an example. The string ST1 may include a first source selection transistor SST1, a second source selection transistor SST2, one or more memory cells MC, and a drain selection transistor DST that are sequentially coupled between a source line SL and the bit line BL. The first source selection transistor SST1 may be more adjacent to the source line SL than the second source selection transistor SST2. The first source selection transistor SST1 may couple the second source selection transistor SST2 to the source line SL. The second source selection transistor SST2 may be closer to the memory cells MC than the first source selection transistor SST1. The second source selection transistor SST2 may couple a memory cell adjacent to the second source selection transistor SST2, among the memory cells MC, to the first source selection transistor SST1. In the string ST1, the first source selection transistor SST1 may be coupled to a first source selection line SSL11, the second source selection transistor SST2 may be coupled to a second source selection line SSL12, the memory cells MC may be coupled to one or more word lines WL, respectively, and a drain selection transistor DST may be coupled to a drain selection line DSL1.

The strings ST1 to ST8 may be grouped into string groups STG1 to STG4 each including two strings. The two strings included in each of the string groups STG1 to STG4 may share the first and second source selection lines. For example, the first source selection transistors SST1 that are included in the string group STG1 may be coupled to the first source selection line SSL11 in common. The second source selection transistors SST2 that are included in the string group STG1 may be coupled to the second source selection line SSL12 in common.

Like a program operation for a memory cell, a program operation may be performed on a selection transistor (i.e., the first source selection transistor SST1, the second source selection transistor SST2, or the drain selection transistor DST). For example, when a program voltage is applied to the drain selection line DSL1, charges may be injected into the floating gate of the drain selection transistor DST, and the threshold voltage of the drain selection transistor DST may rise. In this case, when a voltage that is higher than the threshold voltage of the drain selection transistor DST is applied to the drain selection line DSL1, the drain selection transistor DST may be turned on and may couple the string ST1 to the bit line BL. Furthermore, when a voltage that is lower than the threshold voltage of the drain selection transistor DST is applied to the drain selection line DSL1, the drain selection transistor DST may be turned off and might not couple the string ST1 to the bit line BL. Accordingly, in order to properly select and access the memory cells MC, the turn-on and turn-off of the selection transistors need to be fully controlled. To this end, it may be important to form a distribution of the threshold voltages of the selection transistors in a predetermined range through a program operation for the selection transistors.

The bit line BL may correspond to each of the bit lines BL1 to BLm, illustrated in FIG. 2. Accordingly, in the memory block MB1, the string ST1 that is coupled to the bit lines BL1 to BLm may include the drain selection transistors DST that are coupled to the drain selection line DSL1 in common. Similarly, in the memory block MB1, the string ST2 that is coupled to the bit lines BL1 to BLm may include the drain selection transistors DST that are coupled to the drain selection line DSL2 in common. Other selection transistors that are included in the memory block MB1 may be similarly constructed. Hereinafter, a method of performing a program operation on selection transistors in a memory block unit in order to form a distribution of the threshold voltages of the selection transistors according to an embodiment will be described.

Referring back to FIG. 1, the control circuit 12 may perform a pre-program operation on selection transistors (i.e., the first source selection transistors SST1, the second source selection transistors SST2, and the drain selection transistors DST) that are included in strings of a memory block and may perform an erase operation and a fine program operation on at least one selection transistors that are included in the strings of the memory block.

Specifically, the pre-program operation for source selection transistors may include the entire program operation that applies a program voltage to all of the source selection transistors that are included in the strings by a predetermined count while increasing the program voltage incrementally; and an additional program operation that further applies a program voltage to the second source selection transistors that are included in the strings. In the additional program operation, the program voltage might not be applied to the first source selection transistors that are included in a string of the memory block.

More specifically, the additional program operation for the source selection transistors may include a-1) an operation that applies the program voltage to the second source selection transistors; a-2) an operation that verifies threshold voltages of target second source selection transistors, among the second source selection transistors, by using a first verification voltage; and a-3) an operation that repeats the operations a-1) and a-2) while increasing the program voltage incrementally until a pass count for the target second source selection transistors is greater than a reference pass count.

In addition, the additional program operation for the source selection transistors may further include a-4) an operation that determines new target second source selection transistors until the pass count is greater than the reference pass count; a-5) an operation that verifies threshold voltages of the new target second source selection transistors by using the first verification voltage; and a-6) an operation that repeatedly performs the operations a-1) and a-2) on the new target second source selection transistors while increasing the program voltage incrementally until a pass count for the new target second source selection transistors is greater than the reference pass count.

A pre-program operation for drain selection transistors may include b-1) an operation that applies a program voltage to target drain selection transistors that are included in strings; b-2) an operation that verifies threshold voltages of the target drain selection transistors by using a first verification voltage; and b-3) an operation that repeats the operations b-1) and b-2) while increasing the program voltage incrementally until a fail count for the target drain selection transistors is less than a reference fail count.

In addition, the pre-program operation for the drain selection transistors may further include b-4) an operation that determines new target drain selection transistors when the fail count is less than the reference fail count; and b-5) an operation that repeatedly performs the operations b-1) and b-2) on the new target drain selection transistors while increasing the program voltage incrementally until a fail count for the new target drain selection transistors is less than the reference fail count.

An erase operation and fine program operation for the drain selection transistors may include c-1) an operation that performs an erase operation on the target drain selection transistors that are included in the strings; c-2) an operation that applies the program voltage to the target drain selection transistors; c-3) an operation that verifies threshold voltages of the target drain selection transistors by using a second verification voltage; c-4) an operation that controls a program for pass transistors, among the target drain selection transistors, so that the program is prohibited; and c-5) an operation that repeats the operations c-2), c-3), and c-4) while increasing the program voltage incrementally until a fail count for the target drain selection transistors is less than a reference fail count.

In addition, the erase operation and fine program operation for the drain selection transistors may further include c-6) an operation that determines new target drain selection transistors until the fail count is less than the reference fail count; c-7) an operation that performs an erase operation on the new target drain selection transistors; and c-8) an operation that repeatedly performs the operations c-2), c-3), and c-4) on the new target drain selection transistors, while increasing the program voltage incrementally until a fail count for the new target drain selection transistors is less than the reference fail count.

The erase operation and fine program operation for the source selection transistors may include d-1) an operation that performs an erase operation on the target second source selection transistors, among the second source selection transistors that are included in the strings; d-2) an operation that applies the program voltage to the target second source selection transistors; d-3) an operation that verifies threshold voltages of the target second source selection transistors by using a second verification voltage; d-4) an operation that controls a program for pass transistors, among the target second source selection transistors, so that the program is prohibited; and d-5) an operation that repeats the operations d-2), d-3), and d-4) while increasing the program voltage incrementally until a fail count for the target second source selection transistors is less than a reference fail count.

In addition, the erase operation and fine program operation for the source selection transistors may further include d-6) an operation that determines new target second source selection transistors when the fail count is less than the reference fail count; d-7) an operation that performs an erase operation on the new target second source selection transistors; and d-8) an operation that repeatedly performs the operations d-2), d-3), and d-4) on the new target second source selection transistors while increasing the program voltage incrementally until a fail count for the new target second source selection transistors is less than the reference fail count.

According to an embodiment, the control circuit 12 may perform a pre-program operation (i.e., a first pre-program operation) on selection transistors that are included in strings of a memory block and may sequentially perform an erase operation, a second pre-program operation, a slow transistor masking operation, and a fine program operation on target selection transistors, among the selection transistors. According to an embodiment, the selection transistors may be one of three types (i.e., the first source selection transistor SST1, the second source selection transistor SST2, and the drain selection transistor DST) that are included in the strings of the memory block.

Specifically, the second pre-program operation may include an operation that applies a program voltage to target selection transistors a predetermined number of times while increasing the program voltage incrementally.

The slow transistor masking operation may include an operation that verifies threshold voltages of the target selection transistors by using a third verification voltage; and an operation that masks slow transistors, among the target selection transistors, with pass transistors.

The fine program operation may include e-1) an operation that applies the program voltage to the target selection transistors; e-2) an operation that verifies threshold voltages of the target selection transistors by using a second verification voltage; e-3) an operation that controls a program for pass transistors, among the target selection transistors, so that the program is prohibited; and e-4) an operation that repeats the operations e-1), e-2), and e-3) while increasing the program voltage incrementally until a fail count for the target selection transistors is less than a reference fail count. In this case, the pass transistors may include a selection transistor having a threshold voltage that is lower than the third verification voltage, among the target selection transistors and a selection transistor having a threshold voltage that is higher than the second verification voltage.

When a fail count is less than a reference fail count, the control circuit 12 may perform an operation that determines new target selection transistors and may further sequentially perform an erase operation, a second pre-program operation, a slow transistor masking operation, and a fine program operation on the new target selection transistors.

Figure 4:
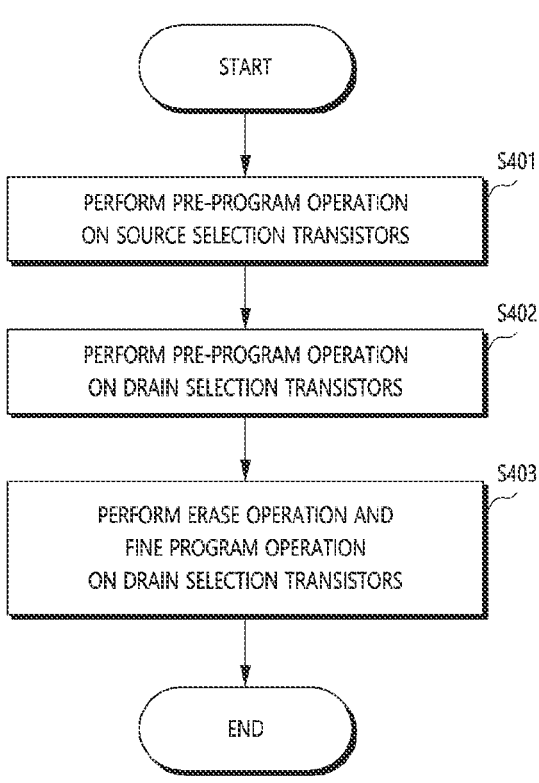
FIG. 4 is a flowchart illustrating a method of forming a distribution of the threshold voltages of selection transistors according to an embodiment.

FIG. 4 is a flowchart illustrating a method of forming a distribution of the threshold voltages of selection transistors according to an embodiment.

Referring to FIG. 4, in operation S401, the control circuit 12 may perform a pre-program operation on the source selection transistors SST (i.e., the first source selection transistors SST1 and the second source selection transistors SST2) that are included in the memory block.

In operation S402, the control circuit 12 may perform a pre-program operation on the drain selection transistors DST.

In operation S403, the control circuit 12 may perform an erase operation and a fine program operation on the drain selection transistors DST.

Figure 5:
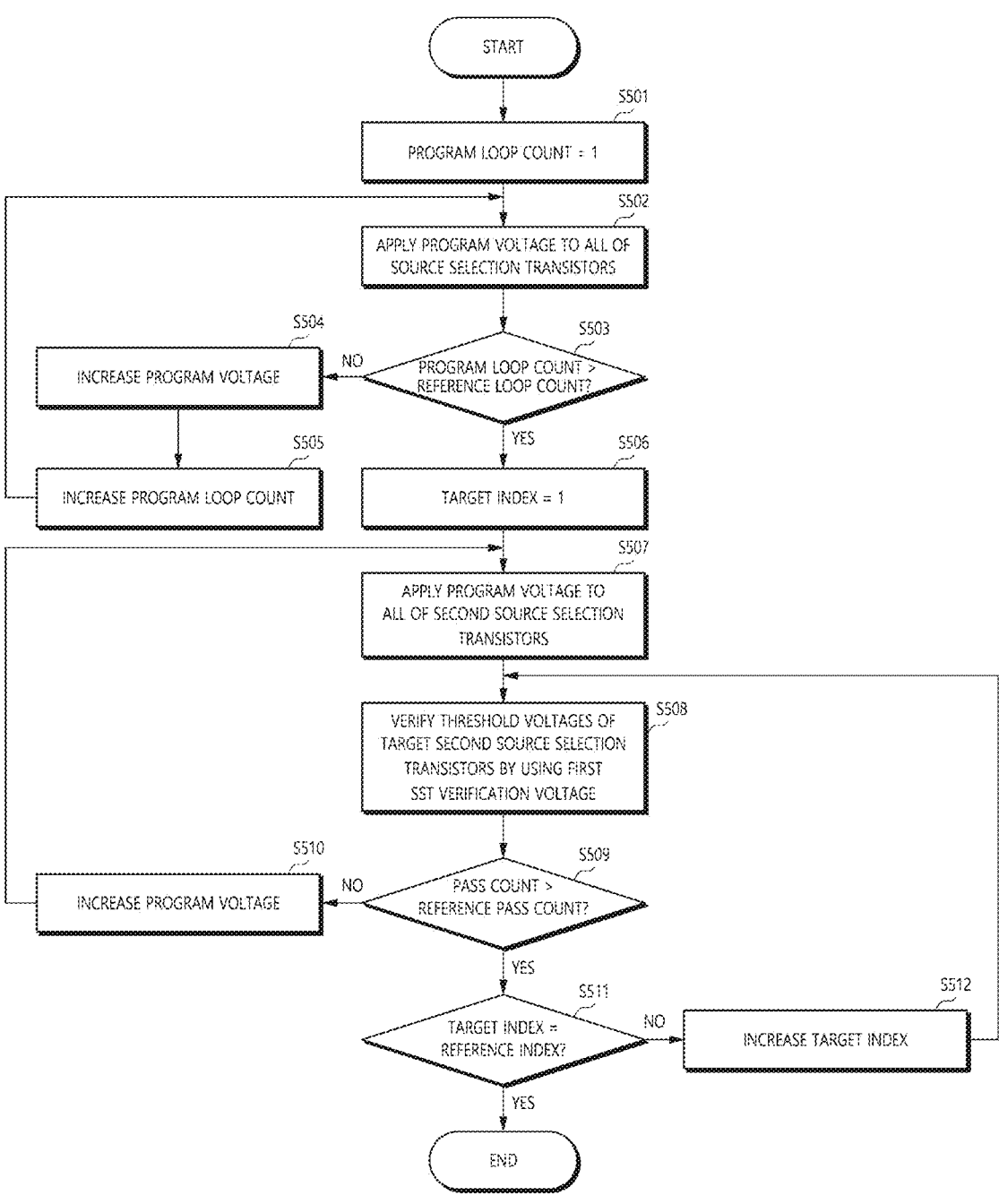
FIG. 5 a flowchart illustrating a method of performing a pre-program operation on source selection transistors according to an embodiment.
Figure 6:
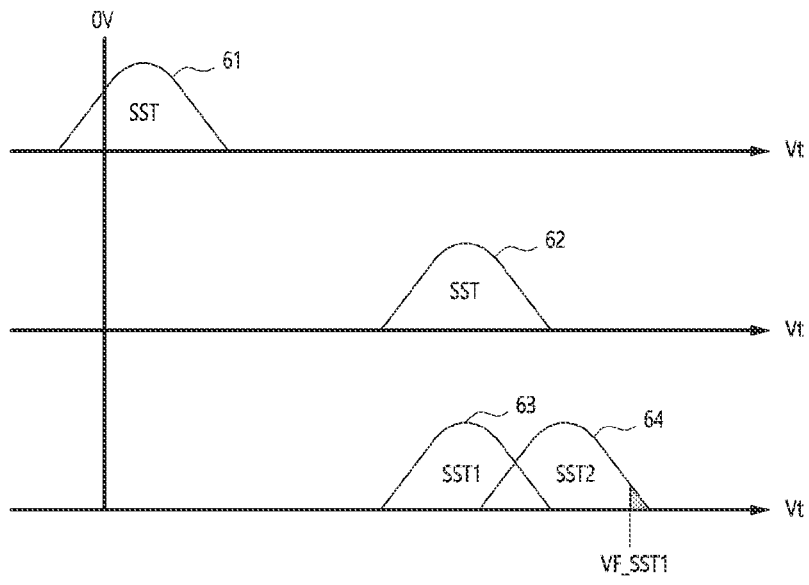
FIG. 6 is a diagram illustrating a change in the distribution of the threshold voltages of source selection transistors when a pre-program operation is performed on the source selection transistors according to a procedure of FIG. 5.

FIG. 5 is a flowchart illustrating a method of performing a pre-program operation on the source selection transistors SST according to an embodiment. A procedure of FIG. 5 may be a detailed embodiment of operation S401 of FIG. 4. FIG. 6 is a diagram illustrating a change in the distribution of the threshold voltages of the source selection transistors SST when the pre-program operation is performed on the source selection transistors SST according to the procedure of FIG. 5. Hereinafter, in the graph of the distribution of threshold voltages, a horizontal axis Vt may mean the threshold voltage, and a vertical axis may mean the number of selection transistors.

Before the pre-program operation is performed, the source selection transistors SST may form the initial threshold voltage distribution 61 of FIG. 6. The initial threshold voltage distribution 61 may indicate the states of the source selection transistors SST right after the memory device has been produced.

Referring to FIG. 5, in operations S501 to S504, the control circuit 12 may perform the entire program operation that applies a program voltage to all of the source selection transistors SST of the memory block a predetermined number of times while increasing the program voltage incrementally. The source selection transistors SST may form an intermediate threshold voltage distribution 62 of FIG. 6 after operations S501 to S504 have been performed, the intermediate threshold voltage distribution 62 being shifted upward from the initial threshold voltage distribution 61.

Specifically, in operation S501, the control circuit 12 may set a program loop count to 1.

In operation S502, the control circuit 12 may simultaneously apply a program voltage to all of the source selection transistors SST of the memory block.

In operation S503, the control circuit 12 may determine whether the program loop count is greater than a reference loop count. When the program loop count is greater than the reference loop count, the procedure may proceed to operation S506. When the program loop count is less than or equal to the reference loop count, the procedure may proceed to operation S504.

In operation S504, the control circuit 12 may increase the program voltage by a predetermined increment.

In operation S505, the control circuit 12 may increase the program loop count by 1. The procedure may proceed to operation S502.

In operations S506 to S512, the control circuit 12 may perform an additional program operation that further applies the program voltage to the second source selection transistors SST2 in order to raise the threshold voltages of the second source selection transistors SST2 closer to a first SST verification voltage VF_SST1. At this time, the program voltage might not be applied to the first source selection transistors SST1. As a result, the second source selection transistors SST2 may form a threshold voltage distribution 64 of FIG. 6 after operations S506 to S512 have been performed. The first source selection transistors SST1 may form a threshold voltage distribution 63, similar to the intermediate threshold voltage distribution 62, even though operations S506 to S512 have been performed. The threshold voltage distribution 63 may be placed in a lower threshold voltage range than the threshold voltage distribution 64. Accordingly, the first source selection transistor SST1 may be turned off in response to a voltage that is lower than the threshold voltage distribution 63 and may be turned on in response to a voltage that is higher than the threshold voltage distribution 63. That is, each of the first source selection transistors SST1 may be maintained to have a lower threshold voltage than each of the second source selection transistors SST2 so as to be advantageous for the turn-off of the first source selection transistors SST1 because the first source selection transistors SST1 are adjacent to the source line SL. The second source selection transistor SST2 may be turned off in response to a voltage that is lower than the threshold voltage distribution 64 and may be turned on in response to a voltage that is higher than the threshold voltage distribution 64.

Specifically, in operation S506, the control circuit 12 may set a target index to 1. According to an embodiment, the target index may be a string index corresponding to each of the strings ST1 to ST8. In this case, hereinafter, the target second source selection transistors SST2 may be the second source selection transistors SST2 of strings corresponding to the target index, among the strings ST1 to ST8 that are coupled to the first to m-th bit lines BL1 to BLm. For example, when the target index is 1, the target second source selection transistors SST2 may be the second source selection transistors SST2 of the strings ST1 that are respectively coupled to the first to m-th bit lines BL1 to BLm, the second source selection transistors SST2 being coupled to the second source selection line SSL12 in common. According to an embodiment, the target index may be a string group index corresponding to each of the string groups STG1 to STG4. In this case, hereinafter, the target second source selection transistors SST2 may be the second source selection transistors SST2 of string groups corresponding to the target index, among the string groups STG1 to STG4 that are coupled to the first to m-th bit lines BL1 to BLm.

In operation S507, the control circuit 12 may simultaneously apply a program voltage to all of the second source selection transistors SST2 of the memory block. In other words, operation S507 may be performed on all of the second source selection transistors SST2 of the memory block in addition to the target second source selection transistors SST2.

In operation S508, the control circuit 12 may verify the threshold voltages of the target second source selection transistors SST2 by using the first SST verification voltage VF_SST1 in FIG. 6 and may generate read values corresponding to the first to m-th bit lines BL1 to BLm, respectively. Specifically, the control circuit 12 may apply the first SST verification voltage VF_SST1 to the second source selection line that is coupled to the target second source selection transistors SST2. The control circuit 12 may detect states (i.e., a current or voltage) of the first to m-th bit lines BL1 to BLm, which are derived by the target second source selection transistors SST2, in response to the first SST verification voltage VF_SST1 and may generate the detected values as the read values corresponding to the first to m-th bit lines BL1 to BLm, respectively.

In operation S509, the control circuit 12 may determine whether a pass count is greater than a reference pass count. The control circuit 12 may determine the pass count based on the read values. The pass count may be the number of first values (e.g., 0), among the read values. The pass count may be the number of second source selection transistors SST2 having threshold voltages that are higher than the first SST verification voltage VF_SST1, among the target second source selection transistors SST2. When the pass count is greater than the reference pass count, the pre-program operation for the target second source selection transistors SST2 may be terminated, and the procedure may proceed to operation S511. When the pass count is less than or equal to the reference pass count, the procedure may proceed to operation S510.

In operation S510, the control circuit 12 may increase the program voltage by a predetermined increment. Furthermore, the procedure may proceed to operation S507.

In operation S511, the control circuit 12 may determine whether the target index is identical to a reference index. When the target index is a string index, the reference index may be the number (i.e., 8) of strings ST1 to ST8 that are coupled to the bit lines BL, respectively. When the target index is a string group index, the reference index may be the number (i.e., 4) of string groups STG1 to STG4 that are coupled to the bit lines BL, respectively. When the target index is identical to the reference index, the procedure may be terminated. When the target index is not identical to the reference index, the procedure may proceed to operation S512.

In operation S512, the control circuit 12 may increase the target index by 1. Furthermore, the procedure may proceed to operation S508, and the control circuit 12 may perform a pre-program operation on target second source selection transistors SST2 of subsequent strings. That is, the control circuit 12 may determine the second source selection transistors SST2 of the subsequent strings as new target second source selection transistors SST2 and may perform the pre-program operation on the new target second source selection transistors SST2.

As a result of the aforementioned operation, only some, at least one, of the second source selection transistors SST2 may have threshold voltages that are higher than the first SST verification voltage VF_SST1, and the threshold voltage of each of the second source selection transistors SST2 might not be excessively higher than the first SST verification voltage VF_SST1. As a result, the turn-on of the source selection transistor SST that is coupled to a selected string can be effectively controlled so that the selected string can be fully coupled to the source line SL.

Figure 7:
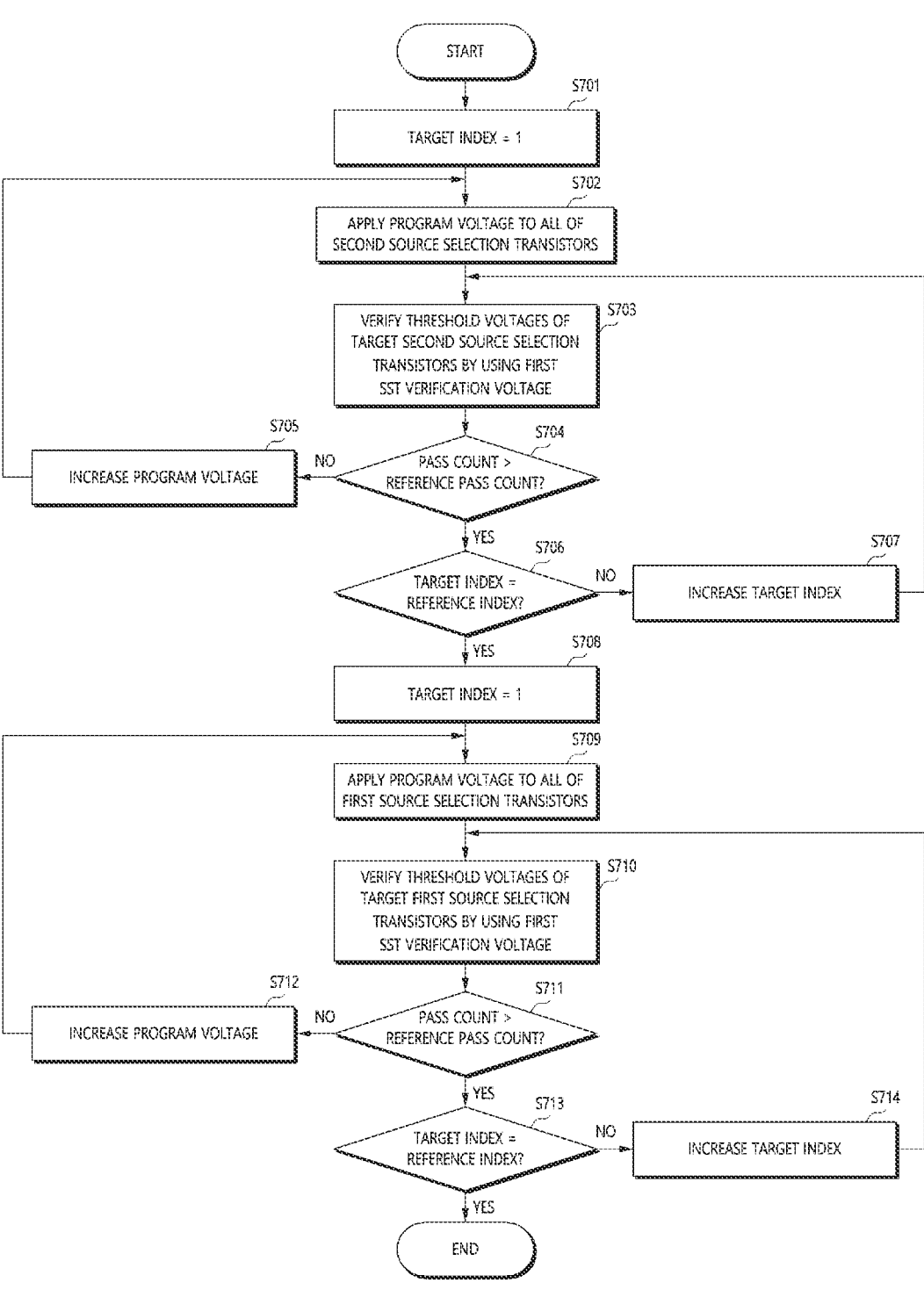
FIG. 7 is a flowchart illustrating a method of performing a pre-program operation on source selection transistors according to an embodiment.
Figure 8:
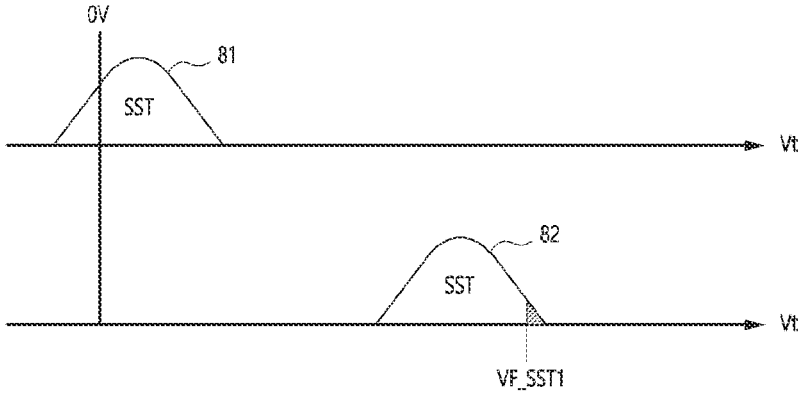
FIG. 8 is a diagram illustrating a change in the distribution of the threshold voltages of source selection transistors when a pre-program operation is performed on the source selection transistors according to a procedure of FIG. 7.

FIG. 7 is a flowchart illustrating a method of performing a pre-program operation on the source selection transistors SST according to an embodiment. The flowchart of FIG. 7 may be a detailed embodiment of operation S401 in FIG. 4. FIG. 8 is a diagram illustrating a change in the distribution of the threshold voltages of the source selection transistors SST when the pre-program operation is performed on the source selection transistors SST according to the procedure of FIG. 7.

Before the pre-program operation is performed, the source selection transistors SST may form the initial threshold voltage distribution 81 of FIG. 8.

In operations S701 to S707, the control circuit 12 may apply a program voltage to only the second source selection transistors SST2 in order to raise the threshold voltages of the second source selection transistors SST2 closer to the first SST verification voltage VF_SST1. At this time, the program voltage might not be applied to the first source selection transistors SST1. Operations S701 to S707 may be performed in a similar manner as operations S506 to S512 in FIG. 5.

In operations S708 to S714, the control circuit 12 may apply the program voltage to only the first source selection transistors SST1 in order to raise the threshold voltages of the first source selection transistors SST1 closer to a first SST verification voltage VF_SST1. At this time, the program voltage might not be applied to the second source selection transistors SST2. Operations S708 to S714 may be performed in a similar manner as operations S506 to S512 in FIG. 5 except that the pre-program operation is performed on the first source selection transistors SST1 instead of the second source selection transistors SST2. According to an embodiment, operations S708 to S714 may be performed earlier than operations S701 to S707.

The source selection transistors SST may form a threshold voltage distribution 82 of FIG. 8 after operations S701 to S714 have been performed. Accordingly, the source selection transistor SST may be turned off in response to a voltage that is lower than the threshold voltage distribution 82 and may be turned on in response to a voltage that is higher than the threshold voltage distribution 82.

Figure 9:
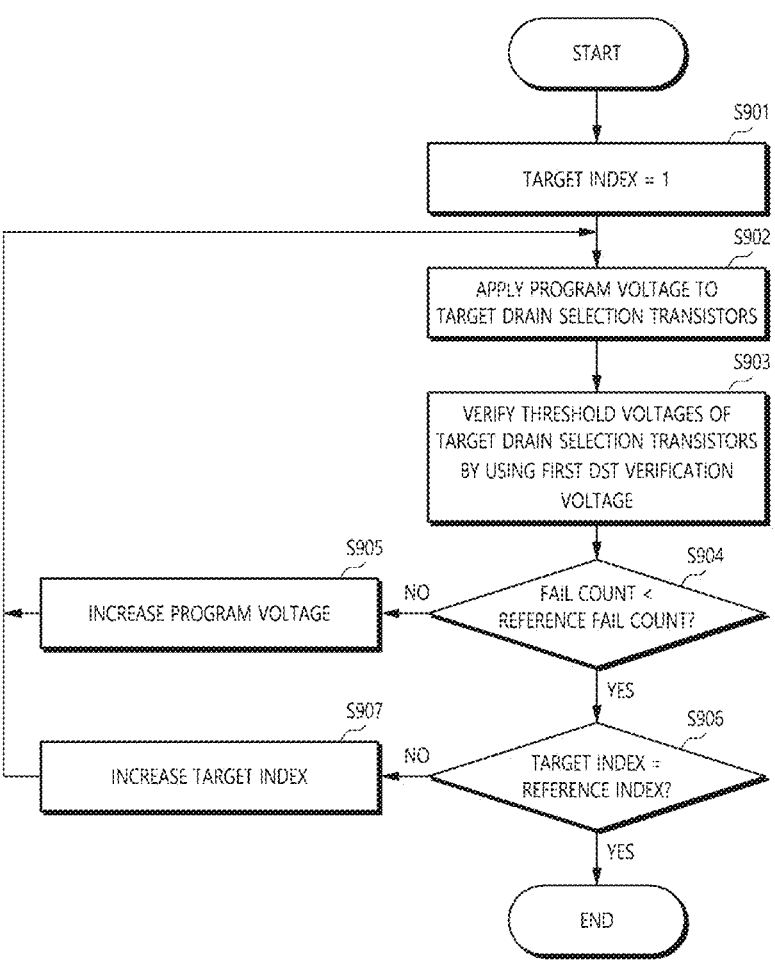
FIG. 9 is a flowchart illustrating a method of performing a pre-program operation on drain selection transistors according to an embodiment.
Figure 10:
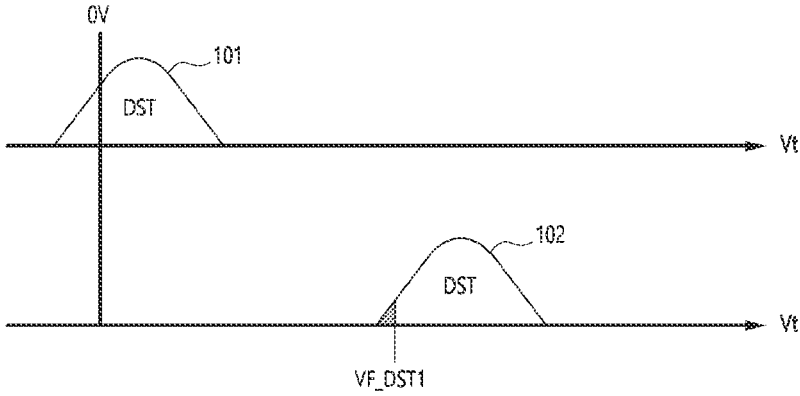
FIG. 10 is a diagram illustrating a change in the distribution of the threshold voltages of drain selection transistors when a pre-program operation is performed on the drain selection transistors according to a procedure of FIG. 9.

FIG. 9 is a flowchart illustrating a method of performing a pre-program operation on the drain selection transistors DST according to an embodiment. A procedure of FIG. 9 may be a detailed embodiment of operation S402 in FIG. 4. FIG. 10 is a diagram illustrating a change in the distribution of the threshold voltages of the drain selection transistors DST when the pre-program operation is performed on the drain selection transistors DST according to the procedure of FIG. 9.

Before the pre-program operation is performed, the drain selection transistors DST may form the initial threshold voltage distribution 101 of FIG. 10.

Referring to FIG. 9, in operations S901 to S907, the control circuit 12 may apply a program voltage to target drain selection transistors DST in order to raise the threshold voltages of the target drain selection transistors DST closer to a first DST verification voltage VF_DST1. The target drain selection transistors DST may form a threshold voltage distribution 102 of FIG. 10 after operations S1201 to S1207 have been performed. Accordingly, the target drain selection transistor DST may be turned off in response to a voltage that is lower than the threshold voltage distribution 102 and may be turned on in response to a voltage that is higher than the threshold voltage distribution 102.

Specifically, in operation S901, the control circuit 12 may set a target index to 1. The target index may be a string index. Accordingly, hereinafter, the target drain selection transistors DST may be the drain selection transistors DST of strings corresponding to the target index, among the strings ST1 to ST8 that are coupled to the first to m-th bit lines BL1 to BLm. For example, when the target index is 1, the target drain selection transistors DST may be the drain selection transistors DST of the strings ST1 that are respectively coupled to the first to m-th bit lines BL1 to BLm, the drain selection transistors DST being coupled to the drain selection line DSL1 in common.

In operation S902, the control circuit 12 may apply a program voltage to the drain selection line that is coupled to the target drain selection transistors DST. At this time, the program voltage might not be applied to the remaining drain selection transistors DST except for the target drain selection transistors DST.

In operation S903, the control circuit 12 may verify the threshold voltages of the target drain selection transistors DST by using the first DST verification voltage VF_DST1 in FIG. 10 and may generate read values corresponding to the first to m-th bit lines BL1 to BLm, respectively. Specifically, the control circuit 12 may apply the first DST verification voltage VF_DST1 to the drain selection line that is coupled to the target drain selection transistors DST. The control circuit 12 may detect states (i.e., a current or voltage) of the first to m-th bit lines BL1 to BLm, which have been derived by the target drain selection transistors DST, in response to the first DST verification voltage VF_DST1, and may generate the detected values as the read values corresponding to the first to m-th bit lines BL1 to BLm, respectively.

In operation S904, the control circuit 12 may determine whether a fail count is less than a reference fail count. The control circuit 12 may determine the fail count based on the read values. The fail count may be the number of second values (e.g., 1), among the read values. The fail count may be the number of drain selection transistors DST having threshold voltages that are lower than the first DST verification voltage VF_DST1, among the target drain selection transistors DST. When the fail count is less than the reference fail count, the pre-program operation for the target drain selection transistors DST may be terminated, and the procedure may proceed to operation S906. When the fail count is equal to or greater than the reference fail count, the procedure may proceed to operation S905.

In operation S905, the control circuit 12 may increase the program voltage by a predetermined increment. Furthermore, the procedure may proceed to operation S902.

In operation S906, the control circuit 12 may determine whether a target index is identical to a reference index. When the target index is a string index, the reference index may be the number (i.e., 8) of strings ST1 to ST8 that are coupled to the bit lines BL, respectively. When the target index is identical to the reference index, the procedure may be terminated. When the target index is not identical to the reference index, the procedure may proceed to operation S907.

In operation S907, the control circuit 12 may increase the target index by 1. Furthermore, the procedure may proceed to operation S902, and the control circuit 12 may perform a pre-program operation on target drain selection transistors DST of subsequent strings.

As a result of the aforementioned operation, only some, at least one, of the target drain selection transistors DST may have a threshold voltages that are lower than the first DST verification voltage VF_DST1. As a result, the turn-off of the drain selection transistor DST that is coupled to an unselected string can be effectively controlled so that the unselected string is not coupled to the bit line BL.

Figure 11:
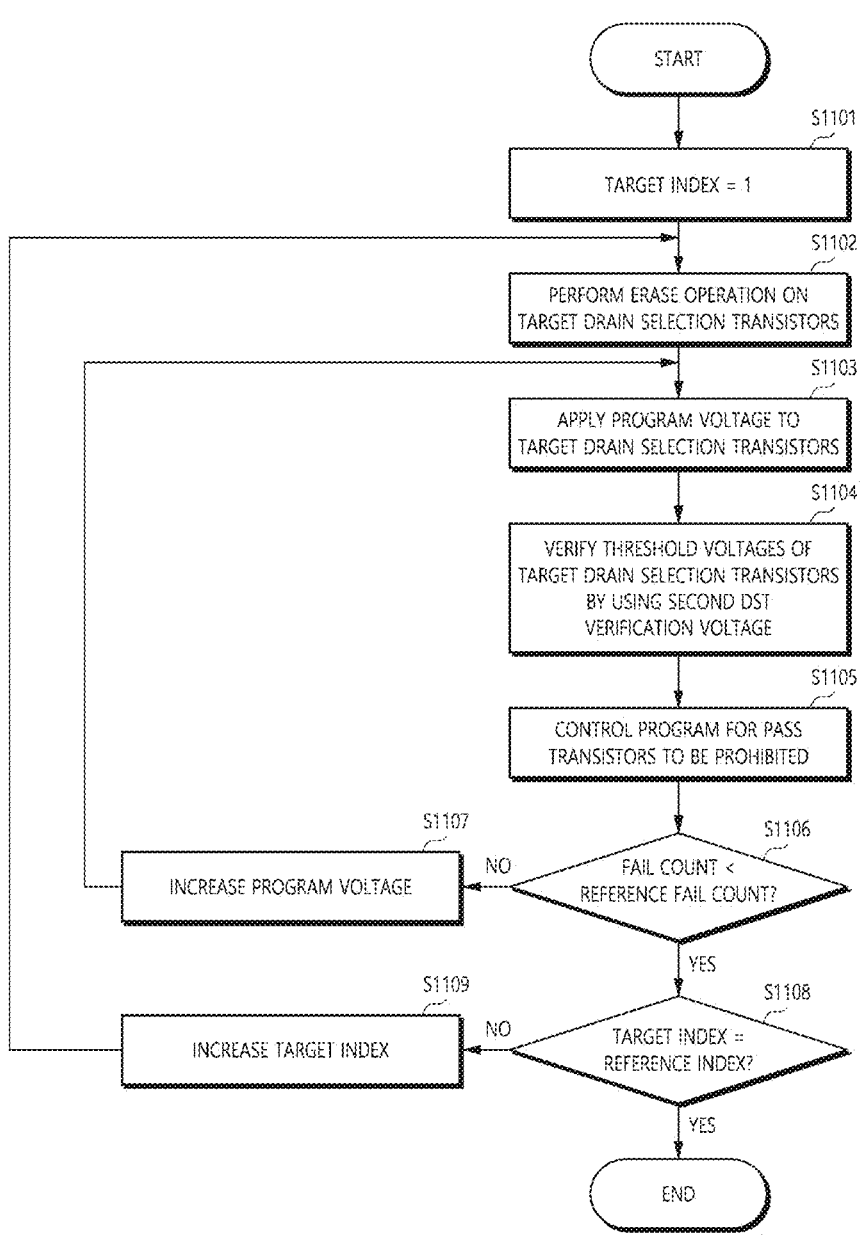
FIG. 11 is a flowchart illustrating a method of performing an erase operation and a fine program operation on drain selection transistors according to an embodiment.
Figure 12:
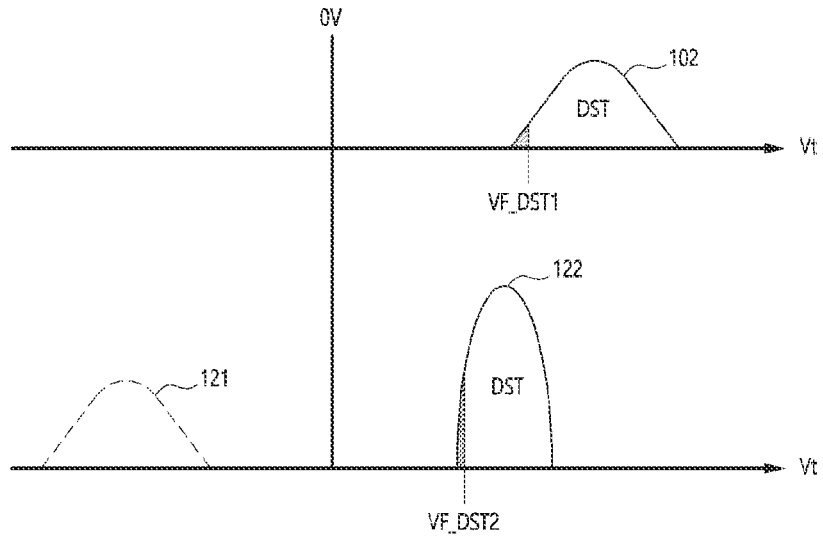
FIG. 12 is a diagram illustrating a change in the distribution of the threshold voltages of drain selection transistors when an erase operation and a fine program operation are performed on the drain selection transistors according to a procedure of FIG. 11.

FIG. 11 is a flowchart illustrating a method of performing an erase operation and a fine program operation on the drain selection transistors DST according to an embodiment. The flowchart of FIG. 11 may be a detailed embodiment of operation S403 in FIG. 4. FIG. 12 is a diagram illustrating a change in the distribution of the threshold voltages of the drain selection transistors DST when the erase operation and the fine program operation are performed on the drain selection transistors DST according to the procedure of FIG. 11.

Referring to FIG. 12, before the erase operation is performed after a pre-program operation is performed, the drain selection transistors DST may form a threshold voltage distribution 102 as described with reference to FIG. 10.

Referring to FIG. 11, in operations S1101 to S1109, the control circuit 12 may perform the erase operation and the fine program operation on the drain selection transistors DST so that the drain selection transistors DST form a narrow threshold voltage distribution 122 of FIG. 12. As a result, the turn-on and turn-off of the drain selection transistors DST can be finely controlled.

Specifically, in operation S1101, the control circuit 12 may set a target index to 1.

In operation S1102, the control circuit 12 may perform the erase operation on the target drain selection transistors DST. The target drain selection transistors DST may form a threshold voltage distribution 121 of FIG. 12 after the erase operation has been performed.

In operation S1103, the control circuit 12 may apply a program voltage to the drain selection line that is coupled to the target drain selection transistors DST. At this time, the program voltage might not be applied to the remaining drain selection transistors DST except for the target drain selection transistors DST.

In operation S1104, the control circuit 12 may verify the threshold voltages of the target drain selection transistors DST by using a second DST verification voltage VF_DST2 and may generate read values corresponding to the first to m-th bit lines BL1 to BLm, respectively. The second DST verification voltage VF_DST2 that is used in the fine program operation may be the same as or different from the first SST verification voltage VF_SST1 that is used in the pre-program operation.

In operation S1105, the control circuit 12 may control a program for pass transistors to be prohibited based on the read values. The pass transistor may be a drain selection transistor DST corresponding to a read value having a first value (e.g., 0), among the target drain selection transistors DST. The pass transistor may be a drain selection transistor DST having a threshold voltage that is higher than the second DST verification voltage VF_DST2, among the target drain selection transistors DST.

In operation S1106, the control circuit 12 may determine whether a fail count is less than a reference fail count. The control circuit 12 may determine the fail count based on the read values. The fail count may be the number of second values (e.g., 1), among the read values. The fail count may be the number of drain selection transistors DST having threshold voltages that are lower than the second DST verification voltage VF_DST2, among the target drain selection transistors DST. When the fail count is less than the reference fail count, the fine program operation for the target drain selection transistors DST may be terminated, and the procedure may proceed to operation S1108. At this time, the drain selection transistors DST on which the erase operation and the fine program operation have not yet been performed may still form the threshold voltage distribution 102. When the fail count is equal to or greater than the reference fail count, the procedure may proceed to operation S1107.

In operation S1107, the control circuit 12 may increase the program voltage by a predetermined increment. Furthermore, the procedure may proceed to operation S1103. In this case, in operation S1103, when applying the program voltage to the target drain selection transistors DST again, the control circuit 12 can control a pass transistor so that the pass transistor is not influenced by the program voltage by applying a program prohibition voltage having a high level to a bit line that is coupled to the pass transistor. Accordingly, the threshold voltage of each of the target drain selection transistors DST can be prevented from rising excessively higher than the second DST verification voltage VF_DST2.

In operation S1108, the control circuit 12 may determine whether a target index is identical to a reference index. When the target index is identical to the reference index, the procedure may be terminated. When the target index is not identical to the reference index, the procedure may proceed to operation S1109.

In operation S1109, the control circuit 12 may increase the target index by 1. Furthermore, the procedure may proceed to operation S1102, and the control circuit 12 may perform an erase operation and a fine program operation on target drain selection transistors DST of subsequent strings. That is, the control circuit 12 may determine the drain selection transistors DST of the subsequent strings as new target drain selection transistors DST and may perform the erase operation and the fine program operation on the new target drain selection transistors DST.

After the erase operation has been performed on the target drain selection transistors DST, the target drain selection transistors DST may form the threshold voltage distribution 121. At this time, the drain selection transistors DST on which the erase operation has not yet been performed may still form the threshold voltage distribution 102 and may be turned off in response to a voltage that is lower than the threshold voltage distribution 102. Accordingly, the erase operation and fine program operation for the target drain selection transistors DST can be effectively performed without being influenced by the drain selection transistors DST on which the erase operation and the fine program operation have not yet been performed.

Figure 13:
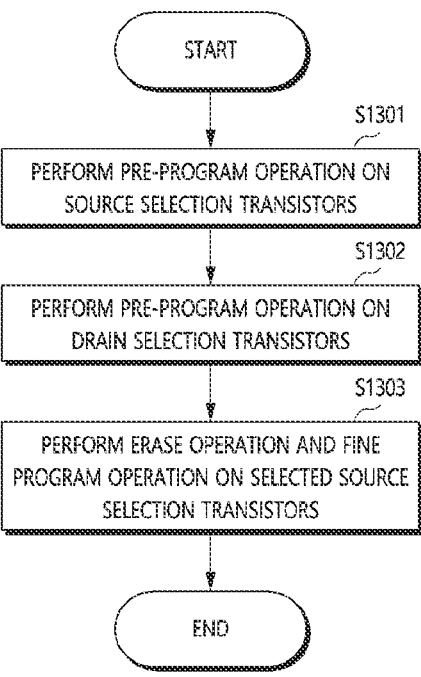
FIG. 13 is a flowchart illustrating a method of forming a distribution of the threshold voltages of selection transistors according to an embodiment.

FIG. 13 is a flowchart illustrating a method of forming a distribution of the threshold voltages of selection transistors according to an embodiment.

Referring to FIG. 13, in operation S1301, the control circuit 12 may perform a pre-program operation on the source selection transistors SST. Operation S1301 may be performed in a similar manner as operation S401 of FIG. 4.

In operation S1302, the control circuit 12 may perform a pre-program operation on the drain selection transistors DST. Operation S1302 may be performed in a similar manner as operation S402 of FIG. 4. According to an embodiment, operation S1302 may be performed earlier than operation S1301.

In operation S1303, the control circuit 12 may perform an erase operation and a fine program operation on selected source selection transistors SST. The selected source selection transistors SST may be the second source selection transistors SST2 except for the first source selection transistors SST1. According to an embodiment, when three or more source selection transistors are coupled to each string in series, a selected source selection transistor may be a source selection transistor that is closest to the memory cells MC in each string.

Figure 14:
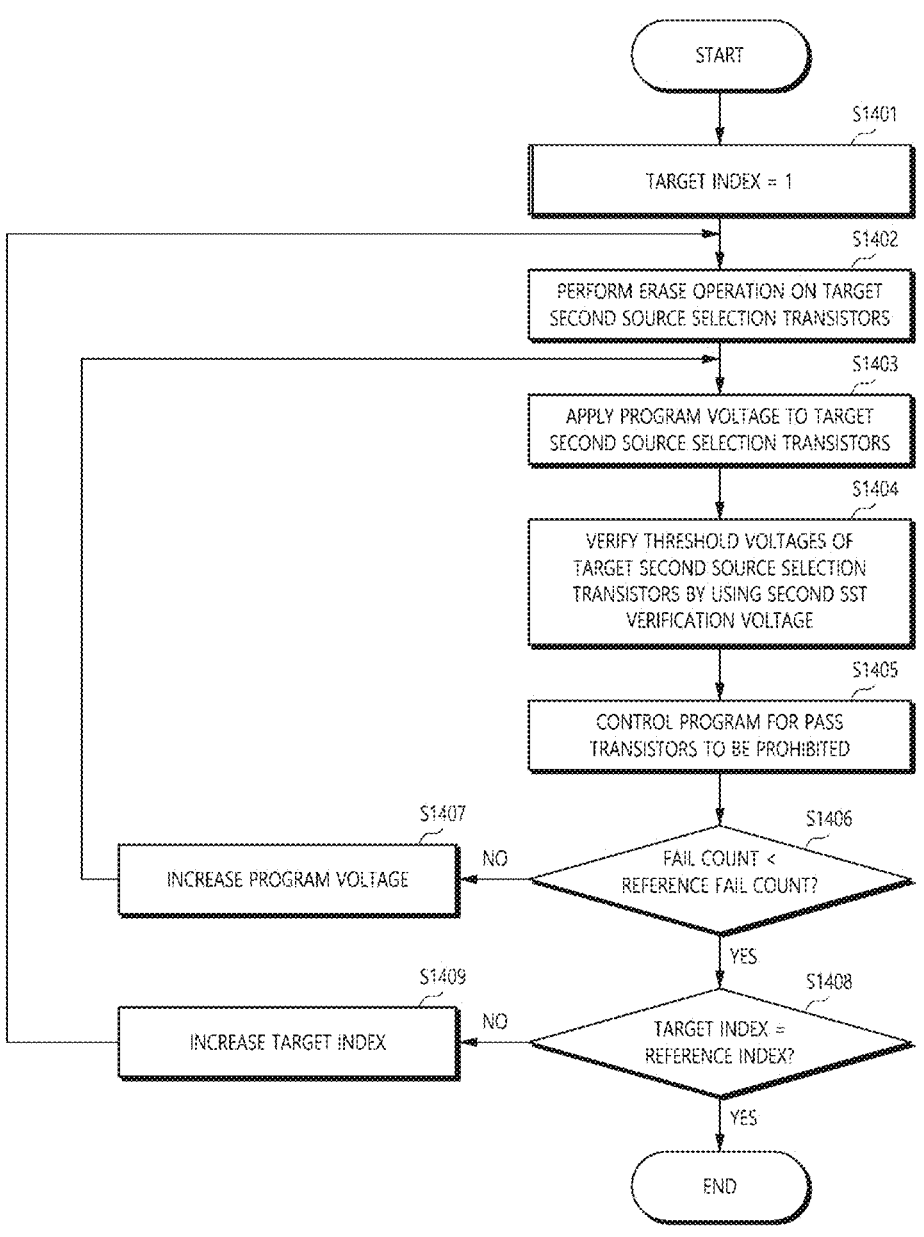
FIG. 14 is a flowchart illustrating a method of performing an erase operation and a fine program operation on second source selection transistors according to an embodiment.
Figure 15:
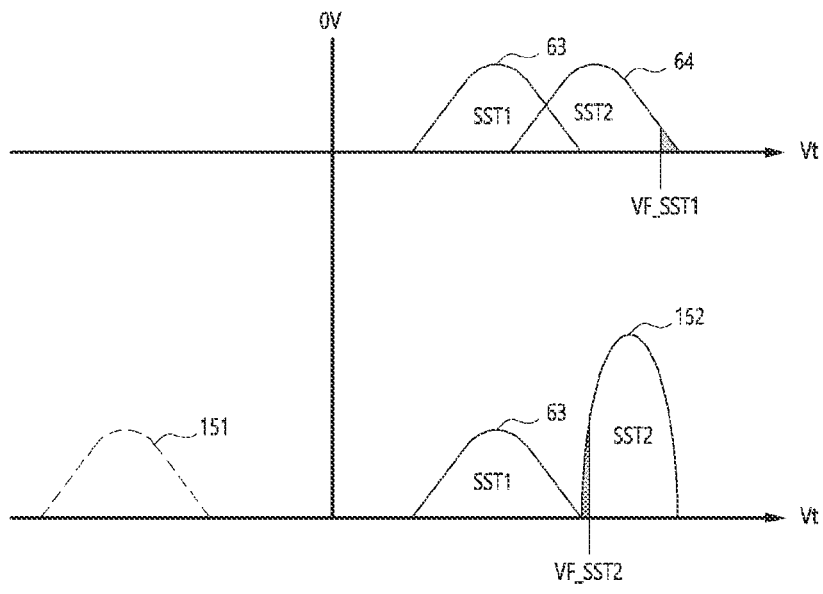
FIG. 15 is a diagram illustrating a change in the distribution of the threshold voltages of source selection transistors when an erase operation and a fine program operation are performed on second source selection transistors according to a procedure of FIG. 14.

FIG. 14 is a flowchart illustrating a method of performing an erase operation and a fine program operation on the second source selection transistors SST2 according to an embodiment. The flowchart of FIG. 14 may be a detailed embodiment of operation S1303 in FIG. 13. FIG. 15 is a diagram illustrating a change in the distribution of the threshold voltages of the source selection transistors SST when the erase operation and the fine program operation are performed on the second source selection transistors SST2 according to the procedure of FIG. 14.

Referring to FIG. 15, before the erase operation is performed after a pre-program operation has been performed, as described with reference to FIG. 6, the first source selection transistors SST1 may form a threshold voltage distribution 63, and the second source selection transistors SST2 may form a threshold voltage distribution 64.

Referring to FIG. 14, in operations S1401 to S1409, the control circuit 12 may perform the erase operation and the fine program operation on the second source selection transistors SST2 so that the second source selection transistors SST2 form a narrow threshold voltage distribution 152 of FIG. 15. As a result, the turn-on and turn-off of the second source selection transistors SST2 can be finely controlled. The first source selection transistors SST1 may maintain the threshold voltage distribution 63. Operations S1401 to S1409 may be performed in a similar manner as operations S1101 to S1109 in FIG. 11 except that the erase operation and the fine program operation are performed on the second source selection transistors SST2 instead of the drain selection transistors DST, and a second SST verification voltage VF_SST2 is used instead of the second DST verification voltage VF_DST2.

Specifically, in operation S1401, the control circuit 12 may set a target index to 1. According to an embodiment, the target index may be a string index. In this case, hereinafter, target second source selection transistors SST2 may be the second source selection transistors SST2 of strings corresponding to the target index, among the strings ST1 to ST8 that are coupled to the first to m-th bit lines BL1 to BLm. According to an embodiment, the target index may be a string group index. In this case, hereinafter, the target second source selection transistors SST2 may be the second source selection transistors SST2 of the string groups STG1 to STG4 corresponding to the target index, among the string groups STG1 to STG4 that are coupled to the first to m-th bit lines BL1 to BLm.

In operation S1402, the control circuit 12 may perform the erase operation on the target second source selection transistors SST2. The target second source selection transistors SST2 may form a threshold voltage distribution 151 of FIG. 15 after the erase operation has been performed.

In operation S1403, the control circuit 12 may apply a program voltage to the second source selection line that is coupled to the target second source selection transistors SST2. At this time, the program voltage might not be applied to the remaining second source selection transistors SST2 except for the target second source selection transistors SST2.

In operation S1404, the control circuit 12 may verify the threshold voltages of the target second source selection transistors SST2 by using the second SST verification voltage VF_SST2 and may generate read values corresponding to the first to m-th bit lines BL1 to BLm, respectively. The second SST verification voltage VF_SST2 that is used in the fine program operation may be the same as or different from the first SST verification voltage VF_SST1 that is used in the pre-program operation.

In operation S1405, the control circuit 12 may control a program for pass transistors to be prohibited based on the read values. The pass transistor may be the second source selection transistor SST2 corresponding to a read value having a first value (e.g., 0), among the target second source selection transistors SST2. The pass transistor may be the second source selection transistor SST2 having a threshold voltage that is higher than the second SST verification voltage VF_SST2, among the target second source selection transistors SST2.

In operation S1406, the control circuit 12 may determine whether a fail count is less than a reference fail count. The control circuit 12 may determine the fail count based on the read values. The fail count may be the number of second values (e.g., 1), among the read values. The fail count may be the number of second source selection transistors SST2 having threshold voltages that are lower than the second SST verification voltage VF_SST2, among the target second source selection transistors SST2. When the fail count is less than the reference fail count, the fine program operation for the target second source selection transistors SST2 may be terminated, and the procedure may proceed to operation S1408. At this time, the second source selection transistors SST2 on which the erase operation and the fine program operation have not yet been performed may still form the threshold voltage distribution 64. When the fail count is equal to or greater than the reference fail count, the procedure may proceed to operation S1407.

In operation S1407, the control circuit 12 may increase the program voltage by a predetermined increment. Furthermore, the procedure may proceed to operation S1403. In this case, in operation S1403, when applying the program voltage to the target second source selection transistors SST2 again, the control circuit 12 may control a pass transistor to not be influenced by the program voltage by applying a program prohibition voltage having a high level to a bit line that is coupled to the pass transistor. Accordingly, the threshold voltage of each of the target second source selection transistors SST2 can be prevented from rising excessively higher than the second SST verification voltage VF_SST2.

In operation S1408, the control circuit 12 may determine whether a target index is identical to a reference index. When the target index is identical to the reference index, the procedure may be terminated. When the target index is not identical to the reference index, the procedure may proceed to operation S1409.

In operation S1409, the control circuit 12 may increase the target index by 1. Furthermore, the procedure may proceed to operation S1402, and the control circuit 12 may perform an erase operation and a fine program operation on target second source selection transistors SST2 of subsequent strings. That is, the control circuit 12 may determine the second source selection transistors SST2 of the next strings as new target second source selection transistors SST2 and may perform the erase operation and the fine program operation on the new target second source selection transistors SST2.

As a result, a program for pass transistors may be prohibited, and only some, at least one, of the target second source selection transistors SST2 have threshold voltages that are lower than the second SST verification voltage VF_SST2. Accordingly, the target second source selection transistors SST2 may form the narrow threshold voltage distribution 152 of FIG. 15.

If the fine program operation is immediately performed while the source selection transistors SST form the initial threshold voltage distribution 61 of FIG. 6, the turn-off of the source selection transistors SST might not be properly controlled. For this reason, it may be difficult for the erase operation and the fine program operation to be properly performed on only the target second source selection transistors SST2. However, while the erase operation in operation S1402 and the fine program operation in operations S1403 to S1407 are being performed on the target second source selection transistors SST2, the second source selection transistors SST2 on which the erase operation and the fine program operation have not yet been performed have high threshold voltages while forming the threshold voltage distribution 64. Accordingly, the second source selection transistors SST2 can be certainly turned off in response to a voltage that is lower than the threshold voltage distribution 64. Likewise, the first source selection transistors SST1 that are coupled to the second source selection transistors SST2 on which the erase operation and the fine program operation have not yet been performed may be turned off in response to a voltage that is lower than the threshold voltage distribution 63 because the first source selection transistors SST1 have formed the threshold voltage distribution 63. Accordingly, the erase operation and fine program operation for the target second source selection transistors SST2 can be effectively performed without being influenced by the second source selection transistors SST2 on which the erase operation and the fine program operation have not yet been performed.

Figure 16:
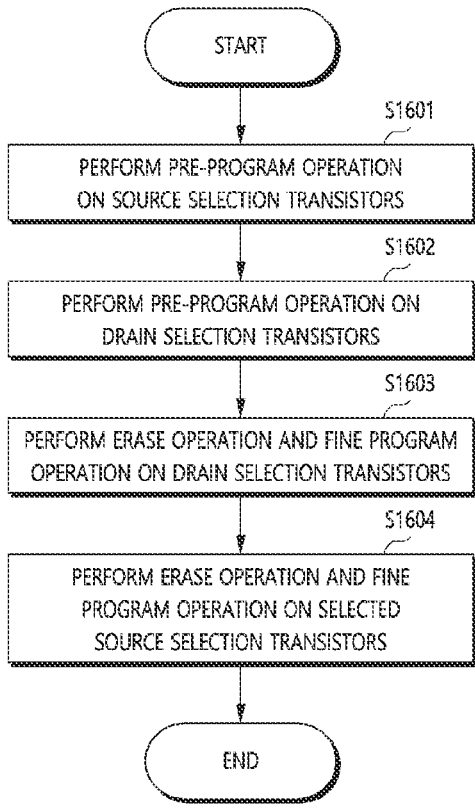
FIG. 16 is a flowchart illustrating a method of forming a distribution of the threshold voltages of selection transistors according to an embodiment.

FIG. 16 is a flowchart illustrating a method of forming a distribution of the threshold voltages of selection transistors according to an embodiment.

Referring to FIG. 16, in operation S1601, the control circuit 12 may perform a pre-program operation on the source selection transistors SST. Operation S1601 may be performed in a similar manner as operation S401 of FIG. 4.

In operation S1602, the control circuit 12 may perform a pre-program operation on the drain selection transistors DST. Operation S1602 may be performed in a similar manner as operation S402 of FIG. 4. According to an embodiment, operation S1602 may be performed earlier than operation S1601.

In operation S1603, the control circuit 12 may perform an erase operation and a fine program operation on the drain selection transistors DST. Operation S1603 may be performed in a similar manner as operation S403 of FIG. 4.

In operation S1604, the control circuit 12 may perform an erase operation and a fine program operation on selected source selection transistors SST. Operation S1604 may be performed in a similar manner as operation S1303 of FIG. 13. According to an embodiment, operation S1604 may be performed earlier than operation S1603.

Figure 17:
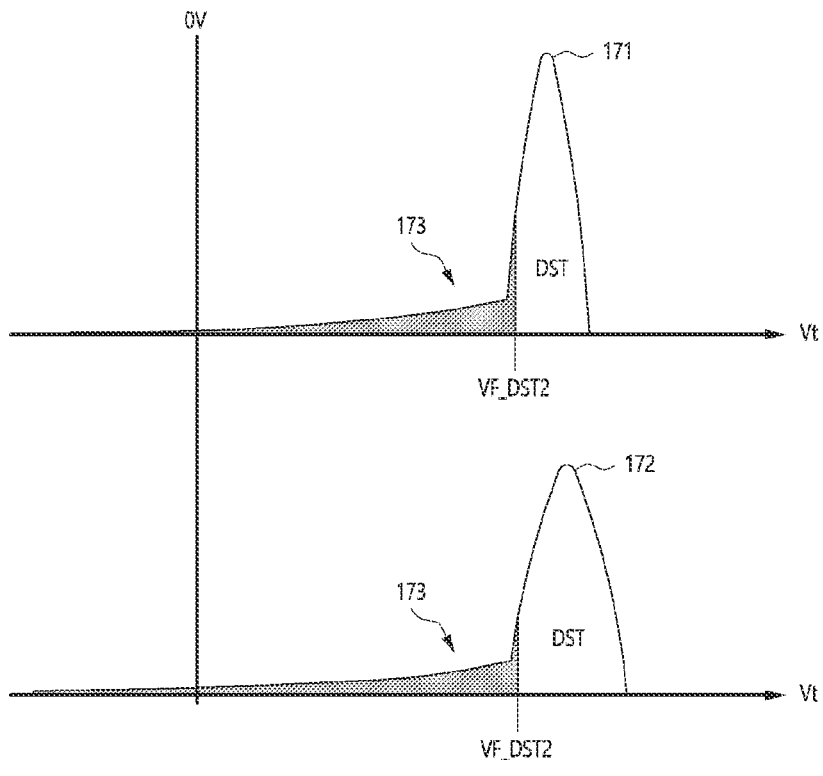
FIG. 17 is a diagram for describing a slow transistor.

FIG. 17 is a diagram for describing a slow transistor.

Referring to FIG. 17, for example, when a fine program operation is performed on the drain selection transistor DST, the threshold voltages of slow transistors 173 may form a long tail distribution because the threshold voltages of the slow transistors 173 rarely rise even though a program voltage is applied to the slow transistors 173. Accordingly, although normal transistors, not the slow transistors 173, form a narrow threshold voltage distribution 171 as pass transistors, operation S1107 of FIG. 11 may be unnecessarily repeated because the fail count condition in operation S1106 of FIG. 11 is not satisfied due to the slow transistors 173.

In this case, there are problems in that the pass transistors may also be indirectly influenced by the program voltage and may form a threshold voltage distribution 172 having a wider voltage range than the threshold voltage distribution 171.

Figure 18:
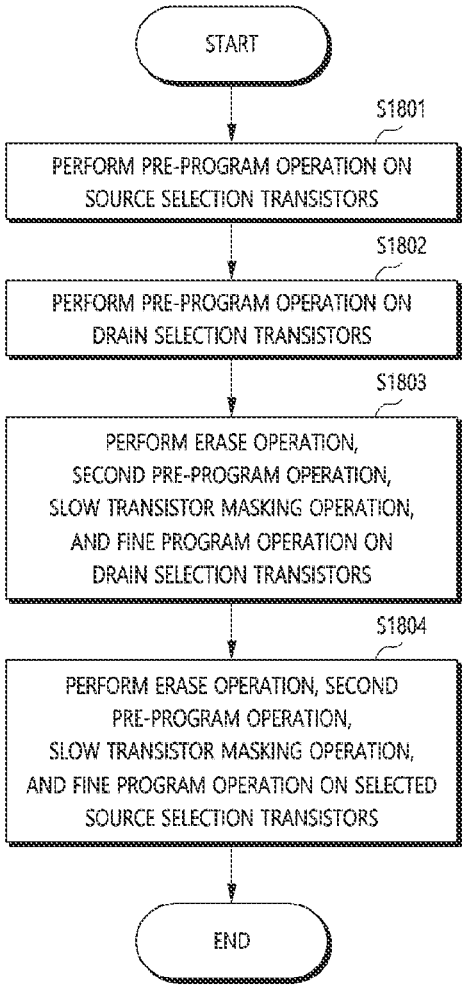
FIG. 18 is a flowchart illustrating a method of forming a distribution of the threshold voltages of selection transistors according to an embodiment.

FIG. 18 is a flowchart illustrating a method of forming a distribution of the threshold voltages of selection transistors according to an embodiment.

Referring to FIG. 18, in operation S1801, the control circuit 12 may perform a pre-program operation on the source selection transistors SST. Operation S1801 may be performed in a similar manner as operation S401 of FIG. 4.

In operation S1802, the control circuit 12 may perform a pre-program operation on the drain selection transistors DST. Operation S1802 may be performed in a similar manner as operation S402 of FIG. 4. According to an embodiment, operation S1802 may be performed earlier than operation S1801.

In operation S1803, the control circuit 12 may perform an erase operation, a second pre-program operation, a slow transistor masking operation, and a fine program operation on the drain selection transistors DST.

In operation S1804, the control circuit 12 may perform an erase operation, a second pre-program operation, a slow transistor masking operation, and a fine program operation on selected source selection transistors SST. According to an embodiment, operation S1804 may be performed earlier than operation S1803.

According to an embodiment, any one of operations S1803 and S1804 may be omitted.

Figure 19:
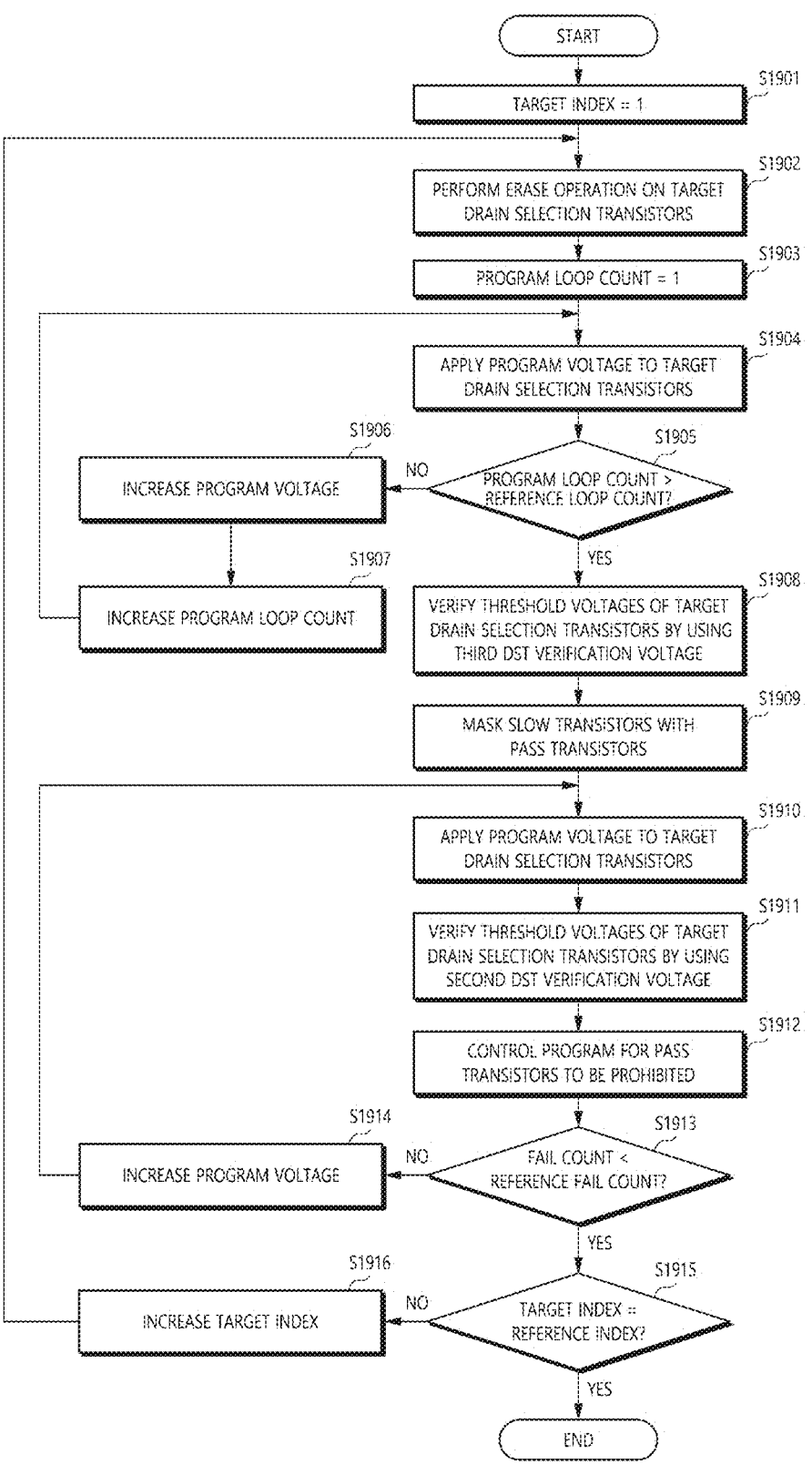
FIG. 19 is a flowchart illustrating a method of performing an erase operation, a second pre-program operation, a slow transistor masking operation, and a fine program operation on drain selection transistors according to an embodiment.
Figure 20:
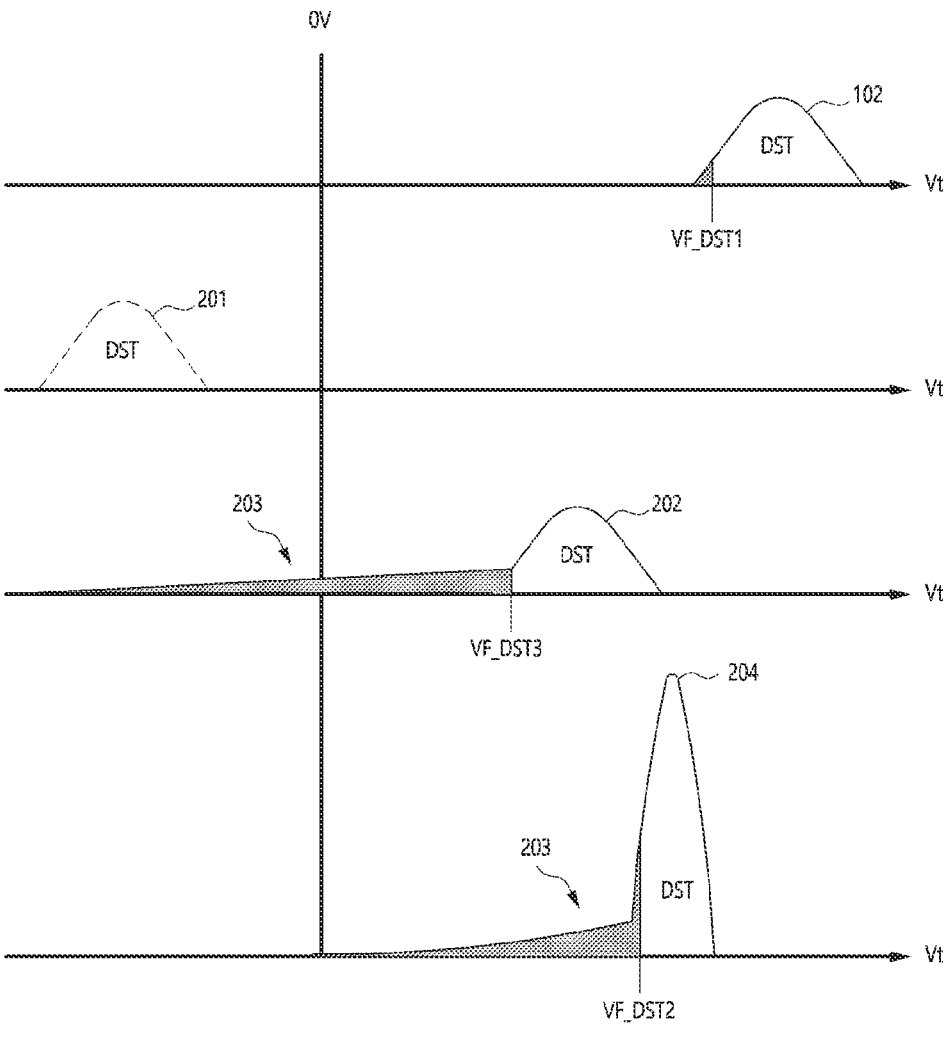
FIG. 20 is a diagram illustrating a change in the distribution of the threshold voltages of drain selection transistors when an erase operation, a second pre-program operation, a slow transistor masking operation, and a fine program operation are performed on drain selection transistors according to an embodiment.

FIG. 19 is a flowchart illustrating a method of performing an erase operation, a second pre-program operation, a slow transistor masking operation, and a fine program operation on the drain selection transistors DST according to an embodiment. The flowchart of FIG. 19 may be a detailed embodiment of operation S1803 of FIG. 18. FIG. 20 is a diagram illustrating a change in the distribution of the threshold voltages of the drain selection transistors DST when the erase operation, the second pre-program operation, the slow transistor masking operation, and the fine program operation are performed on the drain selection transistors DST according to the procedure of FIG. 19.

Referring to FIG. 20, before the erase operation is performed after a pre-program operation has been performed, the drain selection transistors DST may form a threshold voltage distribution 102 as described with reference to FIG. 10.

Referring to FIG. 19, in operations S1901 to S1916, the control circuit 12 may perform the erase operation, the second pre-program operation, the slow transistor masking operation, and the fine program operation on the drain selection transistors DST so that the drain selection transistors DST form a narrow threshold voltage distribution 204 of FIG. 20. As a result, the turn-on and turn-off of the drain selection transistors DST can be finely controlled. In particular, the control circuit 12 can prevent a program voltage from being unnecessarily applied by masking slow transistors 203 of FIG. 20 with pass transistors through the second pre-program operation and the slow transistor masking operation.

Specifically, in operation S1901, the control circuit 12 may set a target index to 1. The target index may be a string index.

In operation S1902, the control circuit 12 may perform the erase operation on target drain selection transistors DST. The target drain selection transistors DST may form a threshold voltage distribution 201 of FIG. 20 after the erase operation has been performed.

In operations S1903 to S1907, the control circuit 12 may perform the second pre-program operation on the target drain selection transistors DST. The target drain selection transistors DST may form an intermediate threshold voltage distribution 202 of FIG. 20 after the second pre-program operation has been performed. The second pre-program operation may be performed to slightly raise the threshold voltages of the target drain selection transistors DST in order to determine the slow transistors.

Specifically, in operation S1903, the control circuit 12 may set a program loop count to 1.

In operation S1904, the control circuit 12 may apply a program voltage to the drain selection line that is coupled to the target drain selection transistors DST. At this time, the program voltage might not be applied to the remaining drain selection transistors DST except for the target drain selection transistors DST.

In operation S1905, the control circuit 12 may determine whether the program loop count is greater than a reference loop count. When the program loop count is greater than the reference loop count, the procedure may proceed to operation S1908. When the program loop count is less than or equal to the reference loop count, the procedure may proceed to operation S1906.

In operation S1906, the control circuit 12 may increase the program voltage by a predetermined increment.

In operation S1907, the control circuit 12 may increase the program loop count by 1. The procedure may proceed to operation S1904.

In operations S1908 to S1909, the control circuit 12 may perform the slow transistor masking operation on the target drain selection transistors DST.

Specifically, in operation S1908, the control circuit 12 may verify the threshold voltages of the target drain selection transistors DST by using a third DST verification voltage VF_DST3 and may generate read values corresponding to the first to m-th bit lines BL1 to BLm, respectively.

In operation S1909, the control circuit 12 may mask the slow transistors with pass transistors. The slow transistor may be a drain selection transistor DST corresponding to a read value having a second value (e.g., 1), among the target drain selection transistors DST. The slow transistor may be a drain selection transistor DST having a threshold voltage that is lower than the third DST verification voltage VF_DST3, among the target drain selection transistors DST. To mask the slow transistor with the pass transistor may mean that the slow transistor is treated as the pass transistor.

In operations S1910 to S1914, the control circuit 12 may perform the fine program operation on the target drain selection transistors DST. The target drain selection transistors DST may form the threshold voltage distribution 204 of FIG. 20 after the fine program operation has been performed. The drain selection transistors DST on which the erase operation, the second pre-program operation, the slow transistor masking operation, and the fine program operation have not yet been performed may still form the threshold voltage distribution 102.

Operations S1910 to S1916 may be performed in a similar manner as operations S1103 to S1109 of FIG. 11. Since the slow transistors have also been masked with the pass transistors in operation S1909, in operation S1912, the pass transistors may include drain selection transistors DST having threshold voltages that are higher than a second DST verification voltage VF_DST2, among the target drain selection transistors DST, and drain selection transistors DST having threshold voltage that are lower than the third DST verification voltage VF_DST3, among the target drain selection transistors DST.

According to an embodiment, when two or more drain selection transistors are coupled to each string in series, the operations that have been performed on the drain selection transistor DST in the disclosure may be similarly applied to each of the drain selection transistors.

Figure 21:
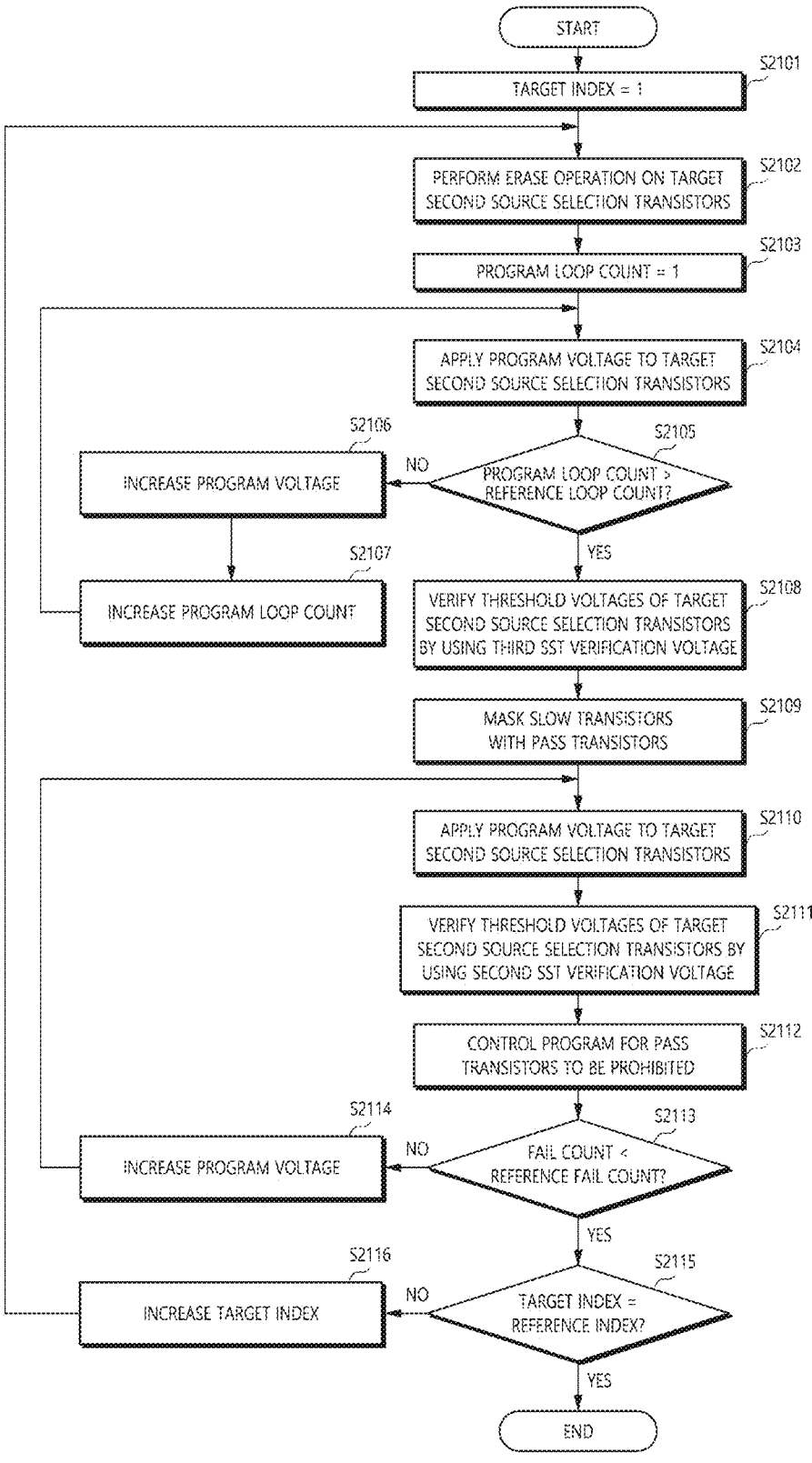
FIG. 21 is a flowchart illustrating a method of performing an erase operation, a second pre-program operation, a slow transistor masking operation, and a fine program operation on second source selection transistors according to an embodiment.

FIG. 21 is a flowchart illustrating a method of performing an erase operation, a second pre-program operation, a slow transistor masking operation, and a fine program operation on the second source selection transistors SST2 according to an embodiment. The flowchart of FIG. 21 may be a detailed embodiment of operation S1804 in FIG. 18.

Operations S2101 to S2116 may be performed in a similar manner as operations S1901 to S1916 in FIG. 19 except that the erase operation, the second pre-program operation, the slow transistor masking operation, and the fine program operation are performed on the second source selection transistors SST2 instead of the drain selection transistors DST, and the third SST verification voltage VF_SST3 is used instead of the third DST verification voltage VF_DST3.

According to an embodiment, when three or more source selection transistors are coupled to each string in series, the operations that have been performed on the second source selection transistor SST2 in the disclosure may be similarly applied to a source selection transistor that is closest to the memory cells MC, among the three or more source selection transistors.

The above description is merely a description of the technical spirit of the present technology, and those skilled in the art may change and modify the present technology in various ways without departing from the essential characteristic of the present technology. Accordingly, the disclosed embodiments should not be construed as limiting the technical spirit of the present technology, but should be construed as describing the technical spirit of the present technology. The technical spirit of the present technology is not restricted by the embodiments. The range of protection of the present technology should be construed based on the following claims, and all of technical spirits within an equivalent range of the present technology should be construed as being included in the scope of rights of the present technology.

What is claimed is:

1. An operating method of a memory device, comprising:
prior to performing an erase operation, performing a pre-program operation on selection transistors that are included in strings, wherein each of the strings comprises a first source selection transistor, a second source selection transistor, a plurality of memory cells, and a drain selection transistor that are sequentially coupled; and
performing the erase operation and a fine program operation on at least one of the selection transistors,
wherein the performing of the pre-program operation comprises:
performing an entire program operation including applying a program voltage to all source selection transistors included in the strings; and
performing an additional program operation including repeatedly applying the program voltage to second source selection transistors included in the strings until a pass count for target second source selection transistors for the additional program operation is greater than a reference pass count, wherein no additional program operation is performed on first source selection transistors included in the strings in the pre-program operation; and
wherein the performing of the fine program operation comprises repeatedly applying the program voltage to target second source selection transistors for the fine program operation until a fail count for the target second source selection transistors for the fine program operation is less than a first reference fail count.

2. The operating method according to claim 1, wherein the program voltage is applied a predetermined number of times while being increased in the entire program operation.

3. The operating method according to claim 1, wherein the performing of the additional program operation comprises:

a first process of applying the program voltage to the second source selection transistors;

a second process of verifying threshold voltages of the target second source selection transistors for the additional program operation by using a verification voltage; and a third process of repeating the first process and the second process while increasing the program voltage incrementally until the pass count for the target second source selection transistors for the additional program operation is greater than the reference pass count.

4. The operating method according to claim 3, wherein the performing of the additional program operation further comprises:

a fourth process of determining new target second source selection transistors for the additional program operation when the pass count is greater than the reference pass count;

a fifth process of verifying threshold voltages of the new target second source selection transistors by using the verification voltage; and a sixth process of repeatedly performing the first process and the second process on the new target second source selection transistors while increasing the program voltage incrementally until a pass count for the new target second source selection transistors is greater than the reference pass count.

5. The operating method according to claim 1, wherein the performing of the pre-program operation comprises:

a first process of applying the program voltage to target drain selection transistors for the pre-program operation among drain selection transistors that are included in the strings;

a second process of verifying threshold voltages of the target drain selection transistors by using a verification voltage; and a third process of repeating the first process and the second process while increasing the program voltage incrementally until a fail count for the target drain selection transistors is less than a second reference fail count.

6. The operating method according to claim 5, wherein the performing of the pre-program operation further comprises:

a fourth process of determining new target drain selection transistors for the pre-program operation when the fail count is less than the second reference fail count; and a fifth process of repeatedly performing the first process and the second process on the new target drain selection transistors while increasing the program voltage incrementally until a fail count for the new target drain selection transistors is less than the second reference fail count.

7. The operating method according to claim 1, wherein the performing of the erase operation and the fine program operation comprises:

a first process of performing the erase operation on target drain selection transistors for the fine program operation among drain selection transistors that are included in the strings;

a second process of applying the program voltage to the target drain selection transistors;

a third process of verifying threshold voltages of the target drain selection transistors by using a verification voltage;

a fourth process of controlling a program for pass transistors, among the target drain selection transistors, so that the program is prohibited; and a fifth process of repeating the second process, the third process, and the fourth process while increasing the program voltage incrementally until a fail count for the target drain selection transistors is less than a third reference fail count.

8. The operating method according to claim 7, wherein the performing of the erase operation and the fine program operation further comprises:

a sixth process of determining new target drain selection transistors for the fine program operation when the fail count is less than the third reference fail count;

a seventh process of performing the erase operation on the new target drain selection transistors; and an eighth process of repeatedly performing the second process, the third process, and the fourth process on the new target drain selection transistors while increasing the program voltage incrementally until a fail count for the new target drain selection transistors is less than the third reference fail count.

9. The operating method according to claim 1, wherein the performing of the erase operation and the fine program operation comprises:

a first process of performing the erase operation on the target second source selection transistors for the fine program operation;

a second process of applying the program voltage to the target second source selection transistors for the fine program operation;

a third process of verifying threshold voltages of the target second source selection transistors for the fine program operation by using a second verification voltage;

a fourth process of controlling a program for pass transistors, among the target second source selection transistors for the fine program operation, so that the program is prohibited; and a fifth process of repeating the second process, the third process, and the fourth process while increasing the program voltage incrementally until the fail count for the target second source selection transistors for the fine program operation is less than the first reference fail count.

10. The operating method according to claim 9, wherein the performing of the erase operation and the fine program operation further comprises:

a sixth process of determining new target second source selection transistors for the fine program operation when the fail count is less than the first reference fail count;

a seventh process of performing the erase operation on the new target second source selection transistors; and an eighth process of repeatedly performing the second process, the third process, and the fourth process on the new target second source selection transistors while increasing the program voltage incrementally until a fail count for the new target second source selection transistors is less than the first reference fail count.

11. A method of operating a memory device, comprising:

performing a first pre-program operation on selection transistors that are included in strings, wherein each of the strings comprises a plurality of memory cells that are coupled between the selection transistors; and sequentially performing an erase operation, a second pre-program operation, a slow transistor masking operation, and a fine program operation on target selection transistors, among the selection transistors that are included in the strings.

12. The method according to claim 11, wherein the performing of the second pre-program operation comprises applying a program voltage to the target selection transistors a predetermined number of times while increasing the program voltage incrementally.

13. The method according to claim 12, wherein the performing of the slow transistor masking operation comprises:

verifying threshold voltages of the target selection transistors by using a first verification voltage; and masking slow transistors, among the target selection transistors, by treating each of the slow transistors as a pass transistor.

14. The method according to claim 13, wherein the performing of the fine program operation comprises:

a first process of applying the program voltage to the target selection transistors;

a second process of verifying threshold voltages of the target selection transistors by using a second verification voltage;

a third process of controlling a program for pass transistors, among the target selection transistors, so that the program is prohibited; and a fourth process of repeating the first process, the second process, and the third process while increasing the program voltage incrementally until a fail count for the target selection transistors is less than a reference fail count.

15. The method according to claim 14, wherein the pass transistors comprise a selection transistor having a threshold voltage that is lower than the first verification voltage, among the target selection transistors, and a selection transistor having a threshold voltage that is higher than the second verification voltage, among the target selection transistors.

16. The method according to claim 14, further comprising:

determining new target selection transistors when the fail count is less than the reference fail count; and sequentially performing the erase operation, the second pre-program operation, the slow transistor masking operation, and the fine program operation on the new target selection transistors.

17. A memory device comprising:

a memory block comprising a plurality of strings, each of the strings comprising selection transistors and a plurality of memory cells that are coupled between the selection transistors; and a control circuit configured to:

perform a first pre-program operation on a plurality of selection transistors that are included in the plurality of strings, and sequentially perform an erase operation, a second pre-program operation, a slow transistor masking operation, and a fine program operation on target selection transistors among the plurality of selection transistors.

18. The memory device according to claim 17, wherein the second pre-program operation comprises applying a program voltage to the target selection transistors a predetermined number of times while increasing the program voltage incrementally.

19. The memory device according to claim 18, wherein the slow transistor masking operation comprises:

verifying threshold voltages of the target selection transistors by using a first verification voltage; and masking slow transistors, among the target selection transistors, by treating each of the slow transistors as a pass transistor.

20. The memory device according to claim 19, wherein the fine program operation comprises:

a first process of applying the program voltage to the target selection transistors;

a second process of verifying threshold voltages of the target selection transistors by using a second verification voltage;

a third process of controlling a program for pass transistors, among the target selection transistors, so that the program is prohibited; and a fourth process of repeating the first process, the second process, and the third process while increasing the program voltage incrementally until a fail count for the target selection transistors is less than a reference fail count.

21. The memory device according to claim 20, wherein the pass transistors comprise a selection transistor having a threshold voltage that is lower than the first verification voltage, among the target selection transistors, and a selection transistor having a threshold voltage that is higher than the second verification voltage, among the target selection transistors.

22. The memory device according to claim 20, wherein the control circuit further configured to:

determine new target selection transistors when the fail count is less than the reference fail count; and sequentially perform the erase operation, the second pre-program operation, the slow transistor masking operation, and the fine program operation on the new target selection transistors.

* * * * *